US007202667B2

United States Patent
Barbic

(10) Patent No.: US 7,202,667 B2
(45) Date of Patent: Apr. 10, 2007

(54) ANISOTROPIC NANOPARTICLE AMPLIFICATION OF MAGNETIC RESONANCE SIGNALS

(75) Inventor: Mladen Barbic, San Gabriel, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/144,902

(22) Filed: Jun. 3, 2005

(65) Prior Publication Data

US 2006/0001423 A1 Jan. 5, 2006

Related U.S. Application Data

(60) Provisional application No. 60/577,907, filed on Jun. 7, 2004.

(51) Int. Cl.
*G01V 3/00* (2006.01)

(52) U.S. Cl. ............... 324/318; 324/300; 324/307; 324/301

(58) Field of Classification Search ............ None
See application file for complete search history.

(56) References Cited

U.S. PATENT DOCUMENTS

| 6,452,388 | B1 * | 9/2002 | Reiderman et al. | 324/303 |
| 6,470,220 | B1 * | 10/2002 | Kraus et al. | 607/103 |
| 2002/0177769 | A1 * | 11/2002 | Orbach et al. | 600/409 |
| 2003/0085703 | A1 * | 5/2003 | Gleich | 324/309 |
| 2004/0066190 | A1 * | 4/2004 | Ju et al. | 324/244.1 |
| 2006/0001423 | A1 * | 1/2006 | Barbic | 324/300 |

FOREIGN PATENT DOCUMENTS

WO    WO 2005121838 A2 * 12/2005

OTHER PUBLICATIONS

A. Aharoni, E.H. Frei, S. Shtrikman and D. Treves, "The Reversible Susceptibility Tensor of the Stoner-Wohlfarth Model", Bull. Res. Counc. of Israel, vol. 6A, 1957, pp. 215-238.

J.A. Sidles and D. Rugar, "Signal-To-Noise Ratios in Inductive and Mechanical Detection of Magnetic Resonance", Physical Review Letters, vol. 70, No. 22, May 31, 1993, pp. 3506-3509.

D.I. Hoult and R.E. Richards, "The Signal-to-Noise Ratio of the Nuclear Magnetic Resonance Experiment", Journal of Magnetic Resonance, vol. 24, 1976, pp. 71-85.

D.I. Hoult and P.C. Lauterbur, "The Sensitivity of the Zeugmatorgraphic Experiment Involving Human Samples", Journal of Magnetic Resonance, vol. 34, 1979, pp. 425-433.

(Continued)

*Primary Examiner*—Diego Gutierrez
*Assistant Examiner*—Tiffany A. Fetzner
(74) *Attorney, Agent, or Firm*—Greer, Burns & Crain, Ltd.

(57) ABSTRACT

The reversible transverse susceptibility of magnetic nanoparticles is used to achieve magnetic flux amplification in magnetic resonance settings. Nanoparticles having substantially uniaxial or unidirectional magnetic anisotropy and a reversible transverse susceptibility in the presence of the high DC magnetic field provide either or both of an amplification of the generated signal of an inductive coil or the detected signal of an inductive coil.

13 Claims, 20 Drawing Sheets

OTHER PUBLICATIONS

H. Bergh and E.W. McFarland, "Nonlinear Coupling and Radiation Damping in Oscillator-Detected Magnetic Resonance of Single Spins", Meas. Sci. Technol., vol. 7, 1969, pp. 1019-1026.

L. Pareti and G.BTurilli, "Detection of Singularities in the Reversible Transverse Susceptibility of an Uniaxial Ferromagnet", J. Appl. Phys., vol. 61, No. 11, Jun. 1, 1987, pp. 5098-6001.

A. Hoare, R.W. Chantrell, W. Schmitt and A. Eiling, "The Reversible Transverse Susceptibility of Particulate Recording Media", J. Phys. D: Appl. Phys., vol. 26, 1993, pp. 461-468.

* cited by examiner

ANISOTROPIC NANOPARTICLE AMPLIFICATION OF MAGNETIC RESONANCE SIGNALS

CLAIM FOR PRIORITY AND REFERENCE TO RELATED APPLICATION

This application claims priority under 35 U.S.C. §119 to prior provisional application 60/577,907 filed Jun. 7, 2004.

FIELD OF THE INVENTION

The invention is the field of magnetic resonance. Example applications of the invention include, but are not limited to, resonance imaging, spectrometry, and atomic resolution microscopy. Additional example applications of the invention include use of the invention in magnetic flux generation devices, and magnetic flux detection devices.

BACKGROUND

In devices that rely upon magnetic resonance, a large direct current magnetic field is applied and alternating current is applied for excitation. Sensitivity limits are well-recognized in magnetic resonance devices. Sensitivity limits result from the low signal to noise ratio in magnetic resonance systems. Prior techniques to increase the signal to noise ratio include the use of ever higher magnetic fields, better amplifier technology, and application of more efficient pulse sequences and signal processing techniques, among others.

Other research efforts have sought to change the basic model of inductive detection used in magnetic resonance devices. Alternate detection techniques that have been researched include, for example, force detection, direct transfer of angular momentum, and energy from the spin population in magnetic resonance using micro-mechanical cantilevers. Additional research has been conducted on the flux-detection class of magnetic resonance sensing schemes such as superconducting quantum interference devices, Hall sensors, and superconducting resonators, as well as optical methods.

Despite the ongoing research, the inductive coil has remained the main workhorse in commercial magnetic resonance systems, both in spectroscopic and imaging settings. One reason for the continued used of inductive coils is that the long-term development of the inductive coil technology successfully kept pace with the improved magnet designs. Another important reason is the versatility of inductive coils as current carrying structures and their utility in providing most of the critical features in a magnetic resonance instrument. Specifically, the inductive coils in magnetic resonance systems serve the dual important functions of providing both the AC magnetic field to excite a sample and detecting the signal from a sample.

In the absence of the large DC magnetic fields of magnetic resonance systems, magnetic amplification has been obtained previously. Significant amplification of the magnetic field produced by a solenoid can be achieved if a soft ferromagnetic material, such as iron, is inserted into the coil structure. However, the ferromagnetic material saturates in the large DC magnetic fields of magnetic resonance systems. Accordingly, research directed toward increasing sensitivity in magnetic resonance systems has looked to other approaches, such as the alternative detection techniques discussed above.

Particular magnetic resonance systems that would benefit from increased sensitivity include, for example, magnetic resonance imaging systems and magnetic resonance spectroscopic systems. Magnetic resonance imaging systems are the primary diagnostic tool in medicine for high resolution imaging of patients. Magnetic resonance spectroscopic techniques are invaluable in analytical chemistry, biology, and materials science. Despite the successful use of magnetic resonance, both spectroscopic and imaging applications of magnetic resonance have low signal-to-noise ratios due to the weak nuclear magnetic moment of the proton and low fractional polarization, even in large magnetic fields, at room temperature.

When the size of a magnetic particle is small enough, usually bellow 100(nm), it becomes energetically unfavorable for the magnetic domain walls to form within the nanoparticles, and the magnetization within them will be uniform. These nanoparticles usually have uniaxial magnetic anisotropy. This regime of nanoparticle magnetism is also called a single domain state, and has been studied by others. The principle is used, for example, in the manufacture of magnetic and optical recording media. The general physics of magnetization processes in single domain magnetic nanoparticles has been extensively studied. Particularly, the reversible transverse susceptibility, $\chi_{RT}$, of single domain nanoparticles has also been studied since the features in $\chi_{RT}$ often reveal fundamental magnetic anisotropy information.

SUMMARY OF THE INVENTION

In the invention, the reversible transverse susceptibility of magnetic nanoparticles is used to achieve magnetic flux amplification in magnetic resonance settings. Nanoparticles having substantially uniaxial or unidirectional magnetic anisotropy and a reversible transverse susceptibility in the presence of the high DC magnetic field provide either or both of an amplification of the generated signal of an inductive coil or the detected signal of an inductive coil.

BREIF DESCRIPTION OF THE DRAWINGS

Figure 5A:
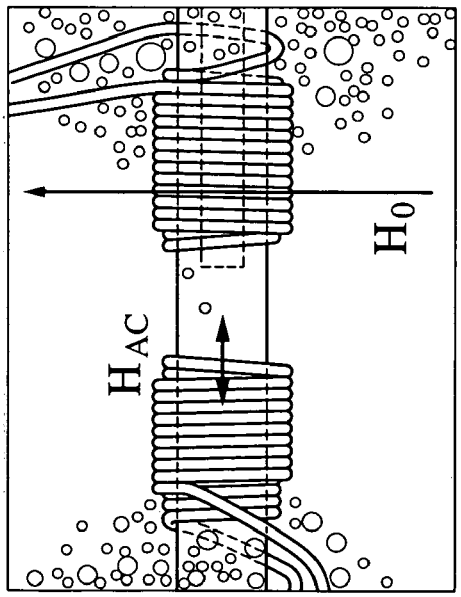
FIG. 5A is an image of an experimental magnetic resonance system of the invention.
Figure 5B:
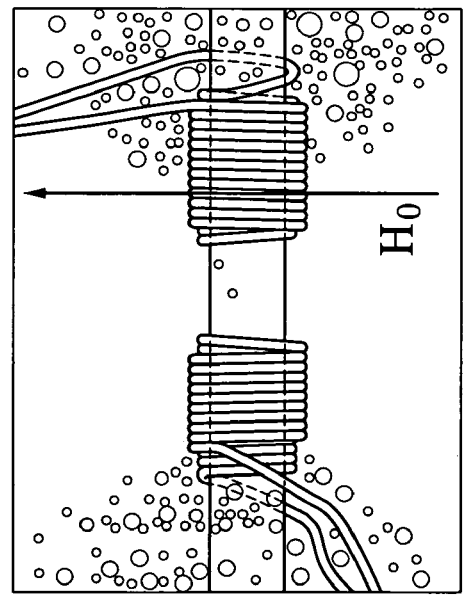
FIG. 5B is an image of an experimental system lacking the nanoparticles used in FIG. 5A.
Figure 6:
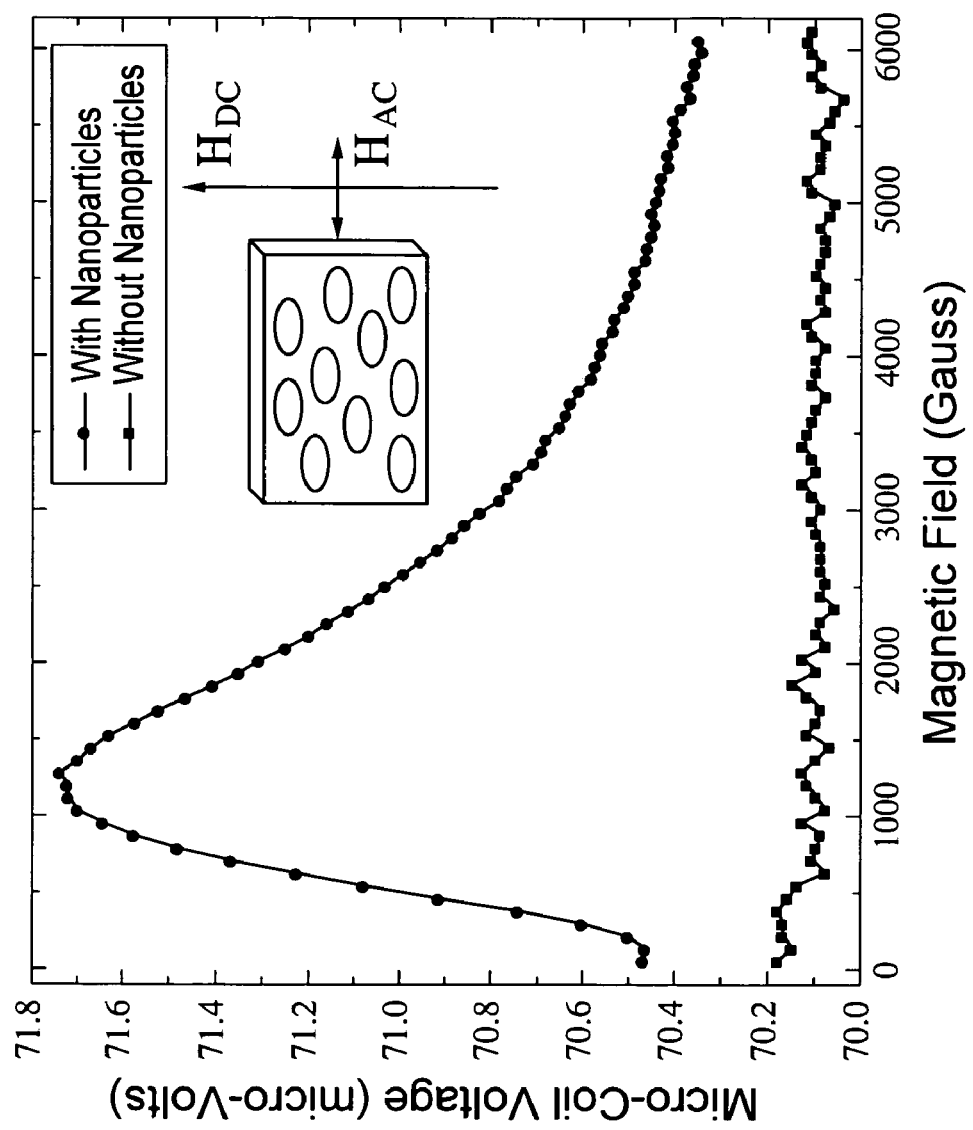
Figure 7:
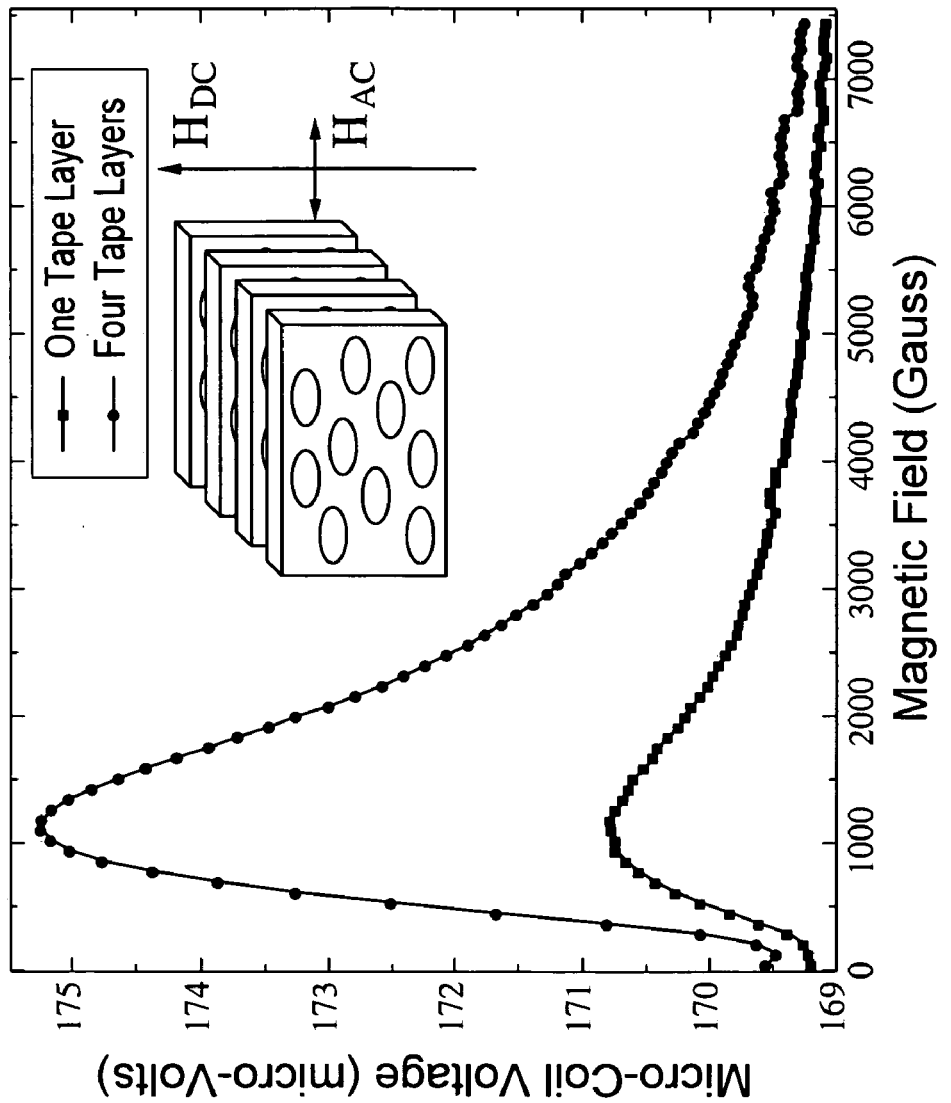
Figure 8:
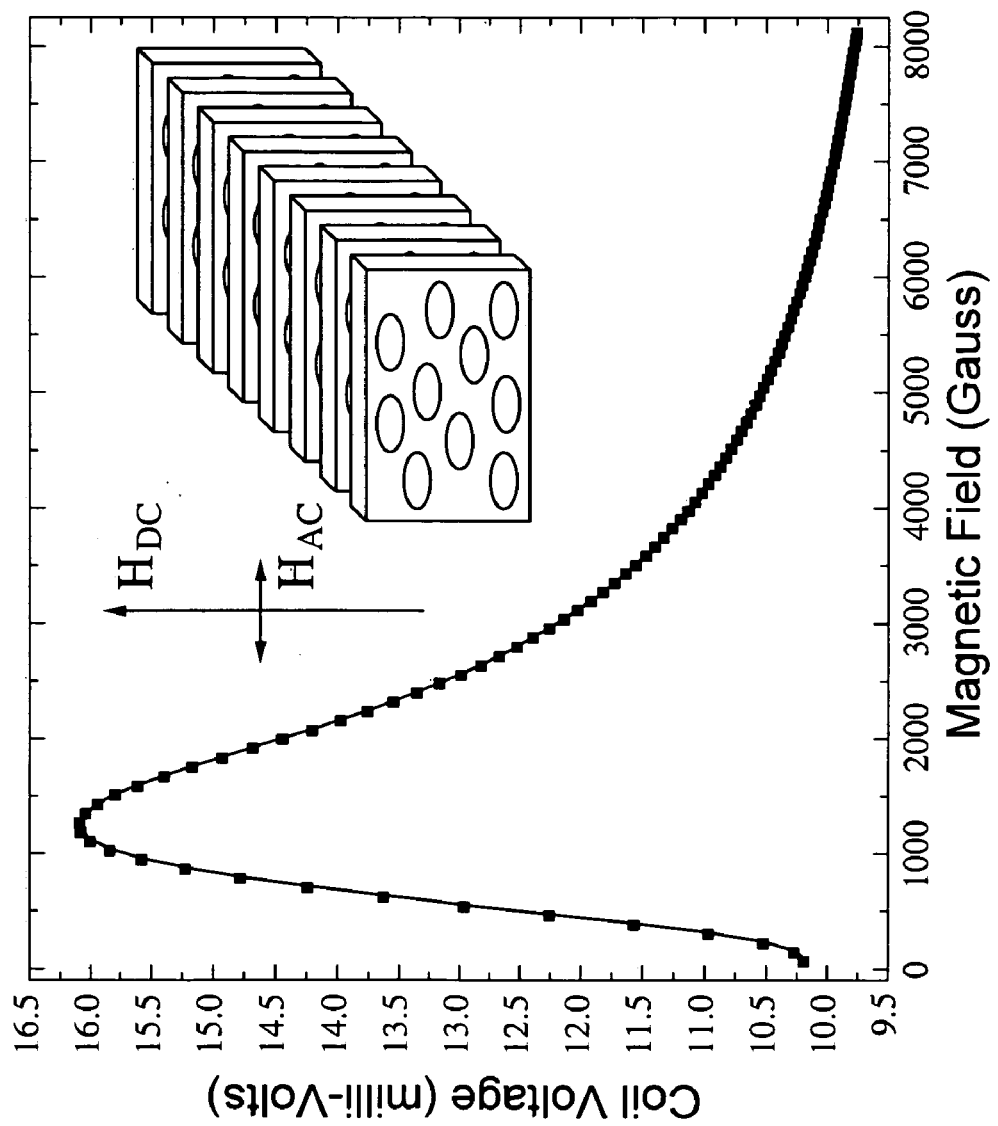
Figure 9:
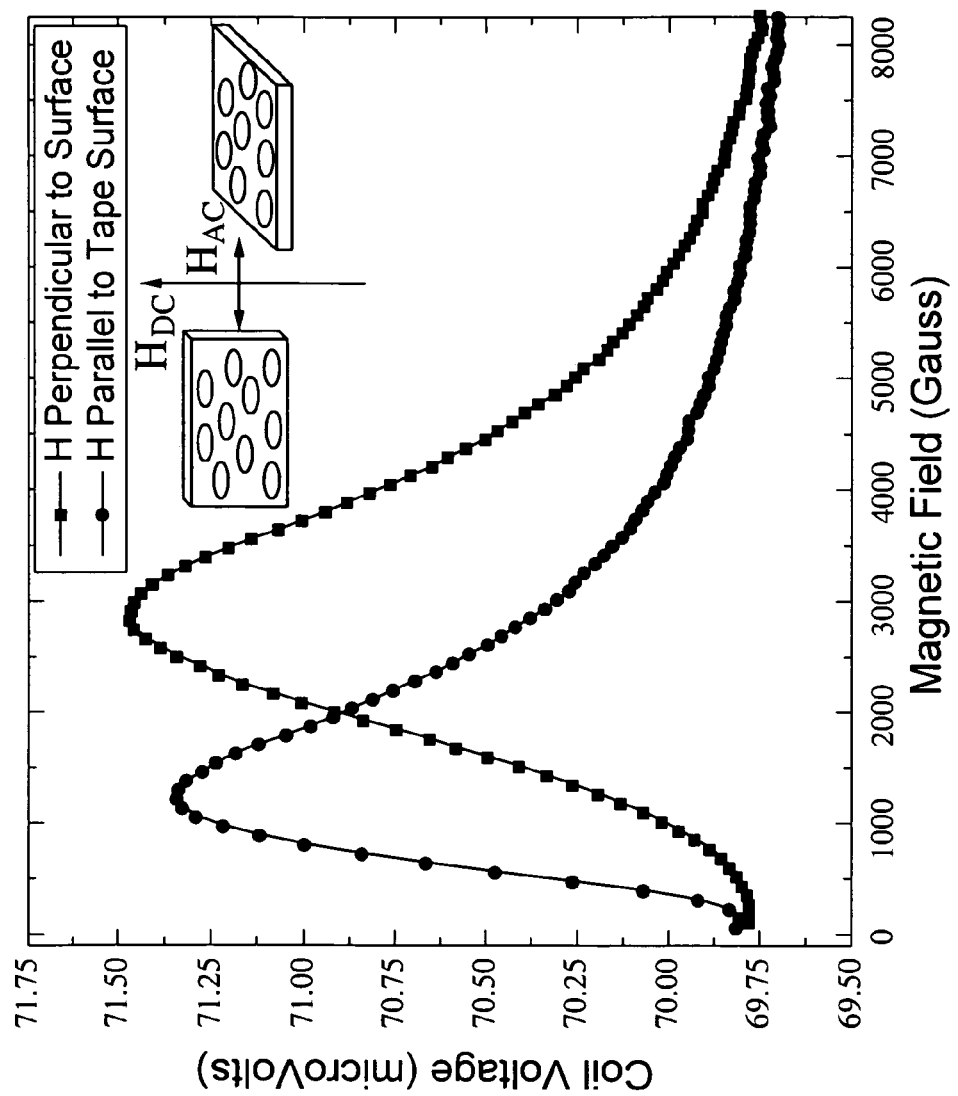
Figure 10:
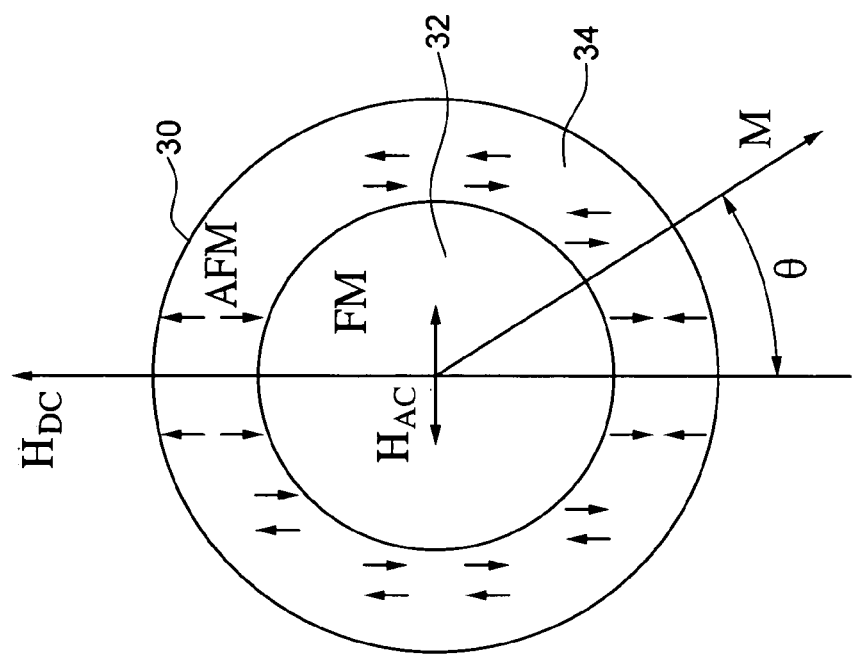
Figure 11:
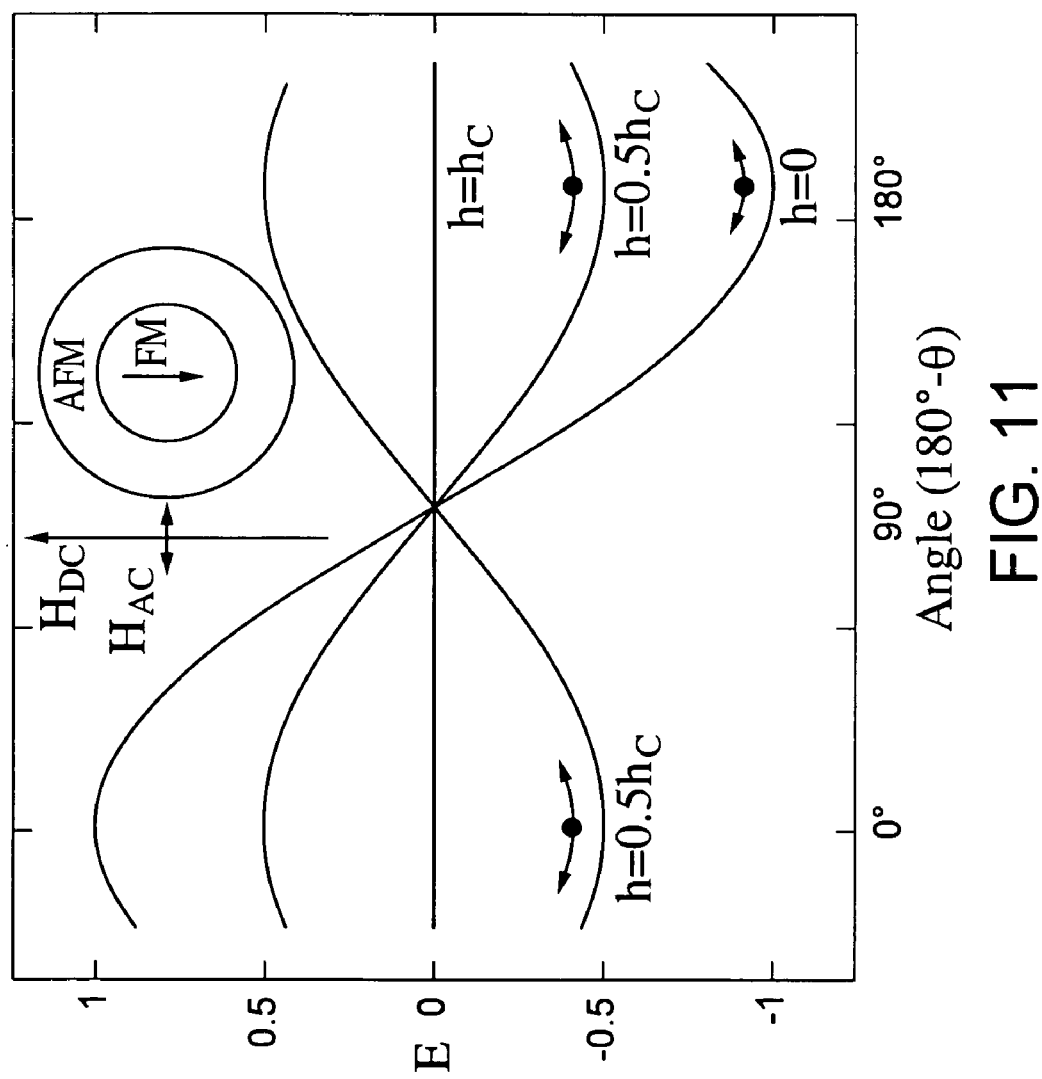
Figure 12:
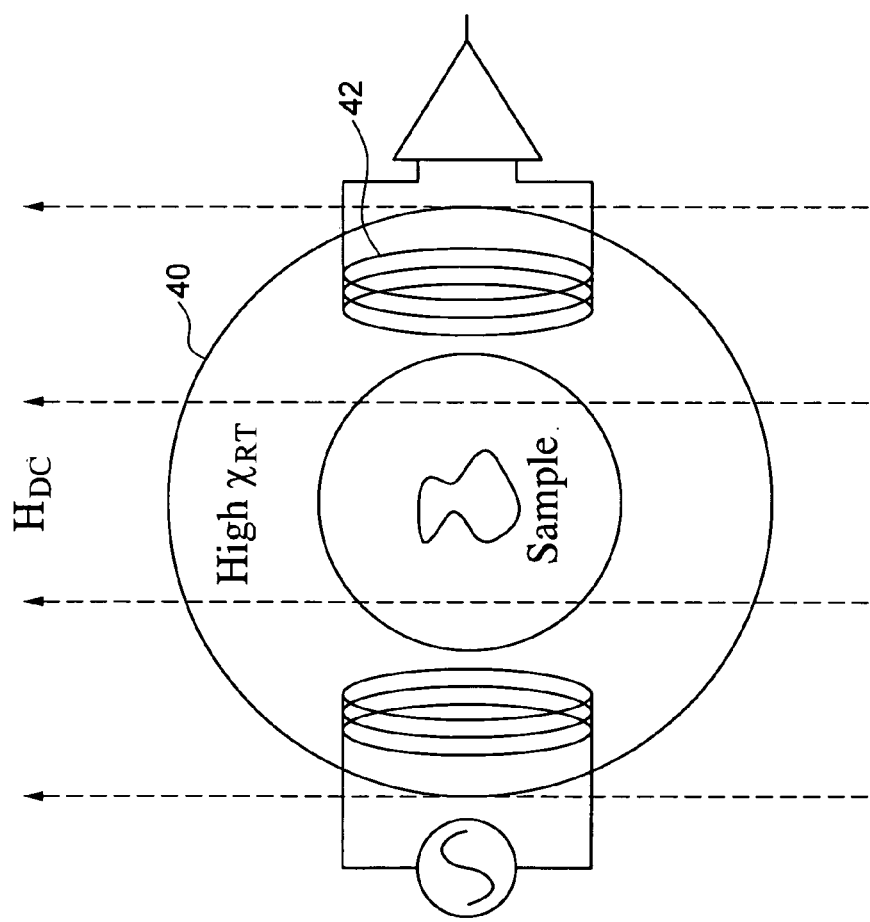
Figure 13:
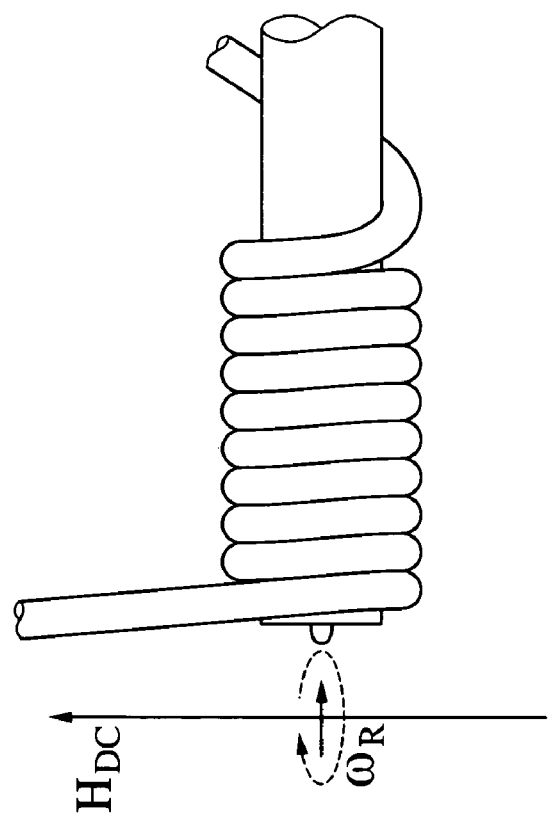
Figure 14:
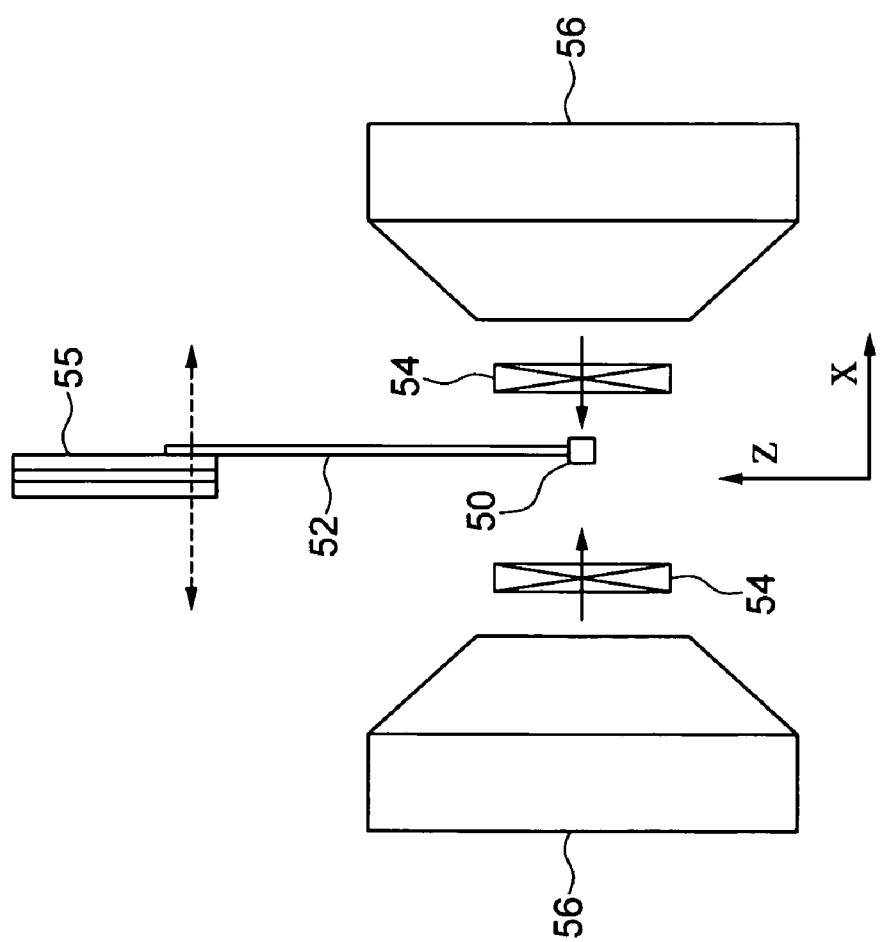
Figure 15:
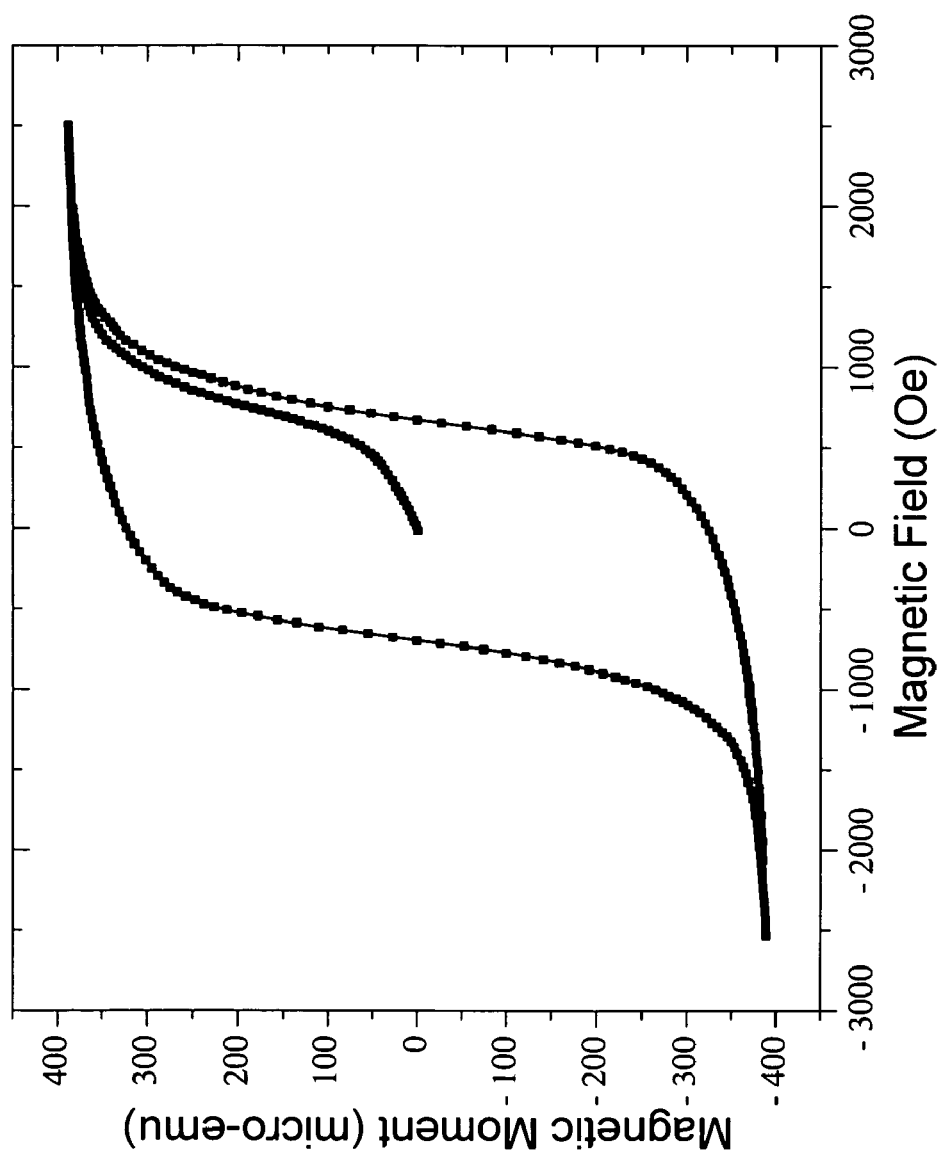
Figure 16:
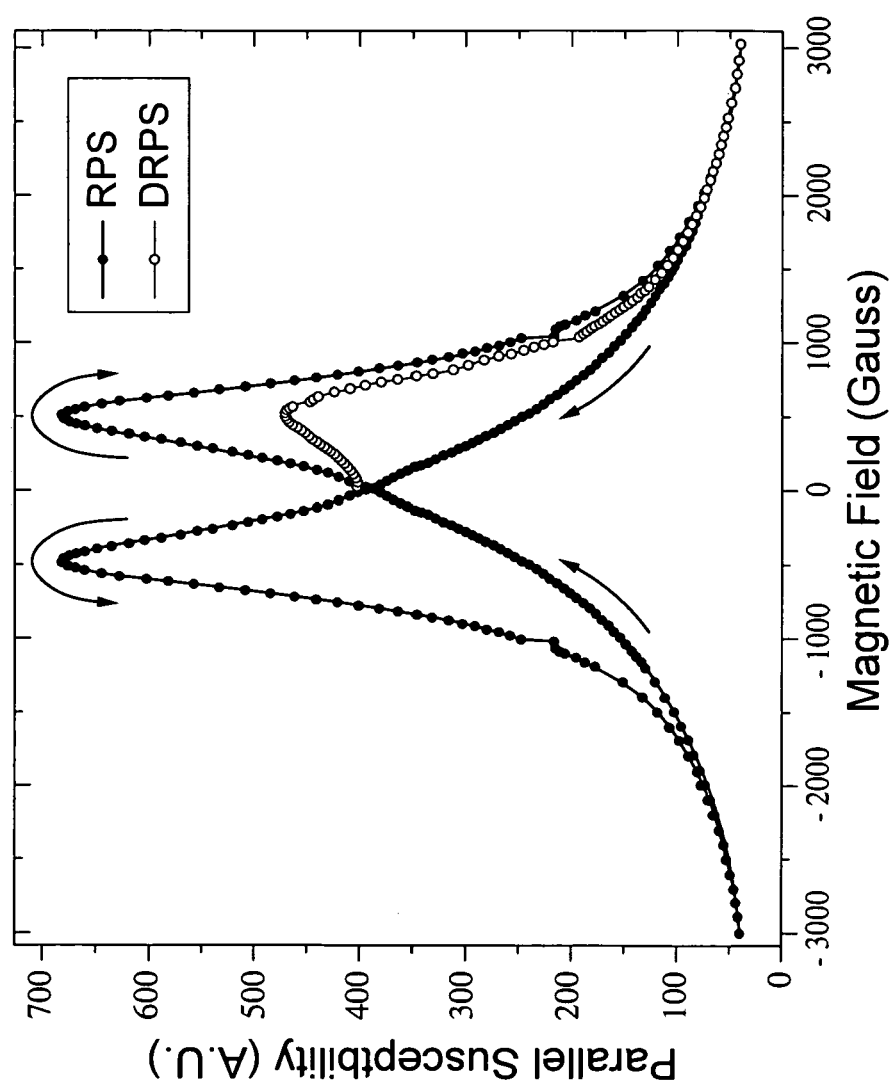
Figure 17:
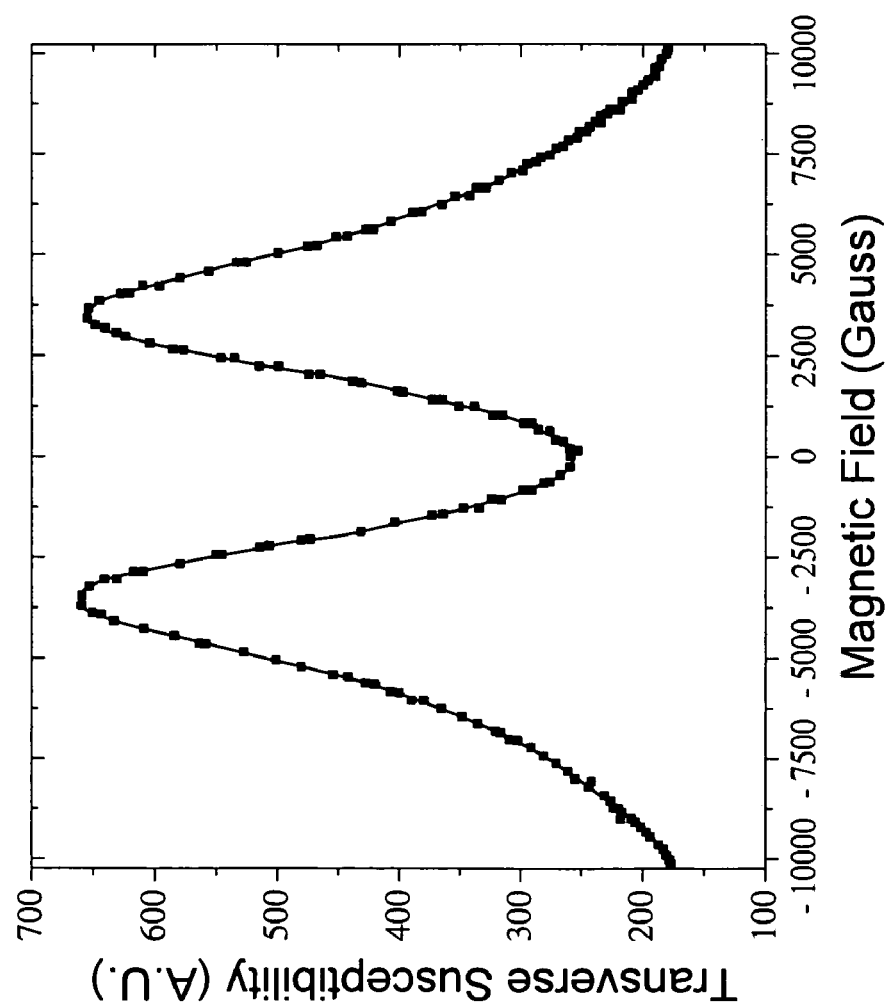
Figure 18A:
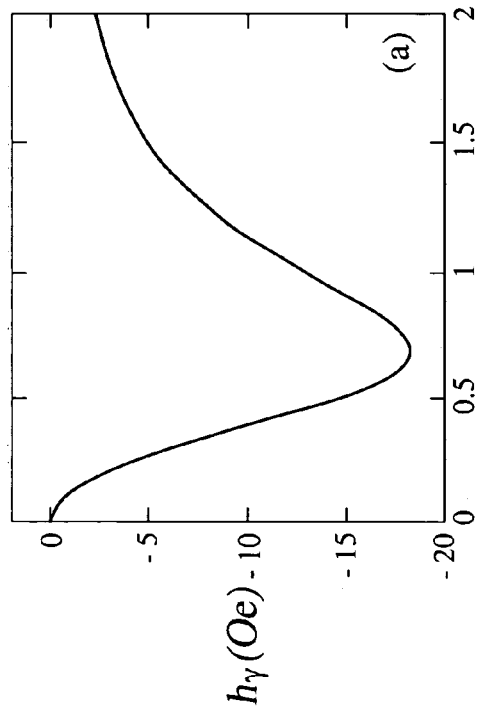
Figure 18B:
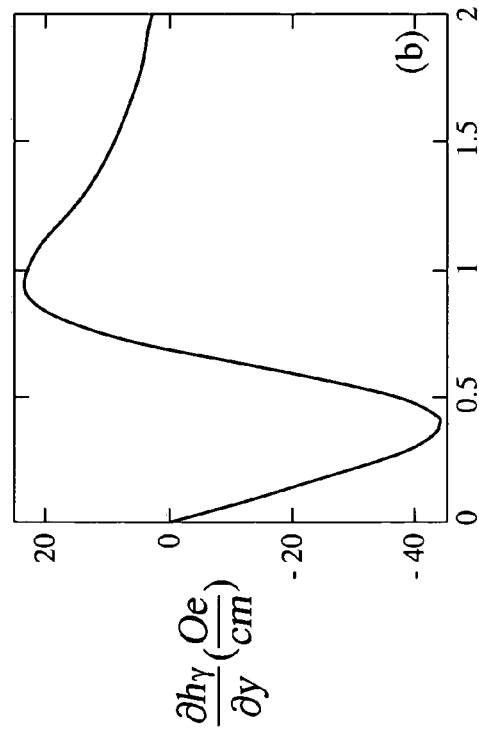
Figure 18C:
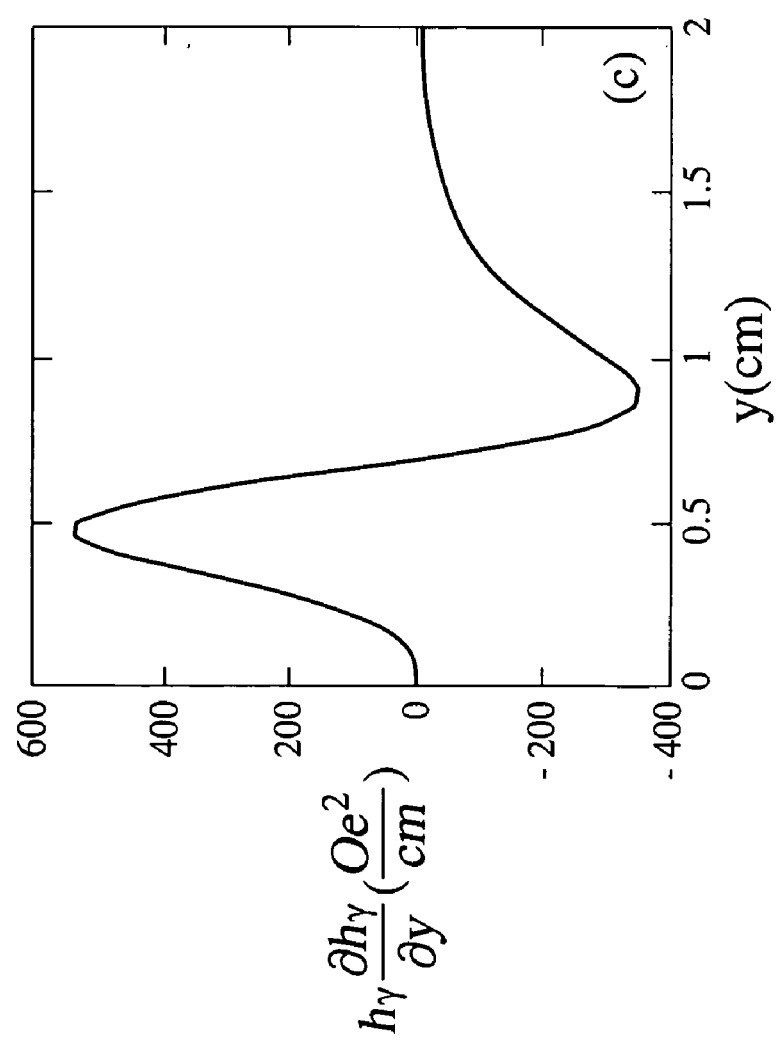

FIG. 6 plots detected AC micro-coil voltage at 3 MHz for the FIGS. 5A and 5B experiment;

FIG. 7 plots a comparison of the AC voltage from the inductive coil detector of FIG. 5A filled with a single magnetic nanoparticle tape layer and the same coil filed with four magnetic nanoparticle tape layers;

FIG. 8 plots the response from an inductive coil detector with a core made from ~100 magnetic nanoparticle tape layers;

FIG. 9 plots the response for the general experimental configuration of FIG. 5A, with the DC magnetic field applied perpendicular to the tape surface;

FIG. 10 illustrates a preferred embodiment composite nanoparticle for use in preferred embodiment amplification methods and magnetic resonance systems of the invention;

FIG. 11 shows the normalized energy diagram for the composite nanoparticle of FIG. 10 as a function of angle (180°–θ) and field;

FIG. 12 illustrates another preferred embodiment magnetic resonance system;

FIG. 13 is an image of an experimental device used to demonstrate magnetic nanoparticle amplification for high-resolution scanning probe magnetic resonance flux microscopy;

FIG. 14 is an illustration of an off-axis implementation of an alternating gradient magnetometer for magnetic susceptibility measurements;

FIG. 15 is a plot of a hysteresis loop along the easy magnetization direction of a magnetic data storage tape;

FIG. 16 shows the measurement $\chi_{RP}$ performed on the same aligned nanoparticle sample as was used in FIG. 15;

FIG. 17 shows the measurement of $\chi_{RT}$ performed on the same aligned nanoparticle sample for which the hysteresis loop was presented in FIG. 15;

FIG. 18A shows the numerically computed plot of the magnetic field from the gradient coils along the y-axis hγ(Oe), FIG. 18B shows the numerically computed plot of the magnetic field gradient from the gradient coils along the y-axis $$\left(\frac{\partial h\gamma}{\partial y}\left(\frac{Oe}{cm}\right)\right);$$

and FIG. 18C shows a plot of the product of the magnetic field and the magnetic field gradient along the y-axis $$\left(h\gamma\frac{\partial h\gamma}{\partial y}\left(\frac{Oe^2}{cm}\right)\right);$$

Figure 19:
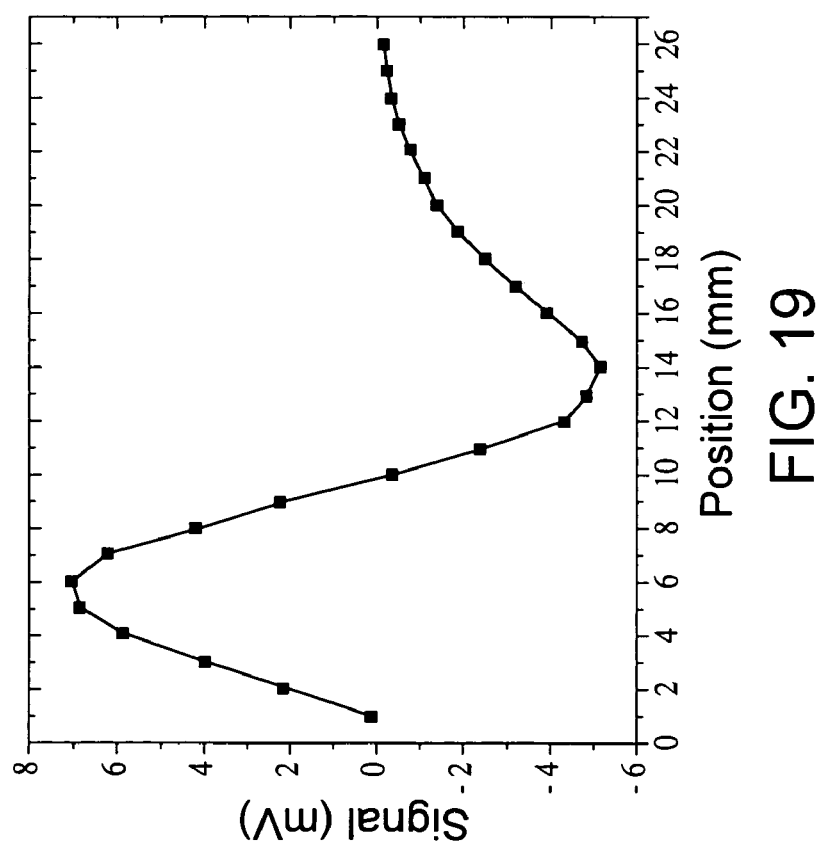

FIG. 19 is a plot illustrating how the signal $\chi_{RT}$ varies with position along the y-axis.

TABLE OF VARIABLES

| Variable | Physical Quantity |
| --- | --- |
| M | Magnetization vector of the magnetic particle |
| h | Reduced field = $H_{Dc}$ * $M_S/2K_U$ |
| $H_0$; $H_{AC}$ | Small AC magnetic field perpendicular to $H_{DC}$ |
| $K_U$ | Uni-axial shape anisotropy constant |
| $H_{DC}$ | Large DC Magnetic field |
| AFM | Anti-ferromagnetic material |
| FM | Ferromagnetic material |
| $M_S$ | Saturation magnetization |
| θ | Angle between magnetization vector and particle easy axis of anisotropy |
| $\omega_R$ | Resonant frequency of spin precession |

TABLE OF VARIABLES -continued

| Variable | Physical Quantity |
| --- | --- |
| RPS/ | Reversible Parallel Susceptibility/ |
| DRPS | RPS (Reversible Parallel Susceptibility) from initial demagnetized sample state |
| RTS | Reversible Transverse Susceptibility |
| α | Angle between DC magnetic field and particle easy axis of anisotropy |

DETAILED DESCRIPTION OF PREFERRED EMBODIMENTS

The invention provides amplification of generated and/or detected alternating transverse magnetic fields produced with inductive coils in the high DC magnetic field conditions typical of magnetic resonance systems. According to the invention, nanoparticles having substantially uniaxial or unidirectional magnetic anisotropy and a reversible transverse susceptibility in the presence of the high DC magnetic field provide either or both of an amplification of the generated signal of an inductive coil or the detected signal of an inductive coil.

The invention recognizes that a particular magnetic parameter of nanoparticles has values that may be leveraged in a resonance system to amplify generated and detected signals when the nanoparticles are correctly arranged with respect to an induction coil(s) of a magnetic resonance system. The magnetic parameter of interest is otherwise known as the Reversible Transverse Susceptibility, $\chi_{RT}$. The invention demonstrates that properly oriented anisotropic single domain magnetic nanoparticles have an appreciable peak in $\chi_{RT}$ at large values of the perpendicular DC magnetic field of a magnetic resonance system, can therefore be used to amplify generated and/or detected transverse alternating magnetic fields.

In a preferred embodiment magnetic resonance system, nanoparticles having substantially uniaxial or unidirectional magnetic anisotropy are arranged within an induction coil. The easy anisotropy axes of the nanoparticles are substantially commonly aligned in a direction that forms an angle with respect to the applied DC magnetic field of the system. The nanoparticles amplify generated and/or detected signals of the induction coil(s) in the system. In a preferred method of the invention, nanoparticles having substantially uniaxial or unidirectional magnetic anisotropy are provided and arranged within respect to the induction coil of a magnetic resonance system to amplify generated and/or detected AC magnetic signals. Additional preferred embodiment devices, systems and methods will be apparent to artisans by reference to the drawings and the following description. The drawings may be presented schematically, but will be understood by artisans. Features may be exaggerated for purposes of illustration.

Figure 1:
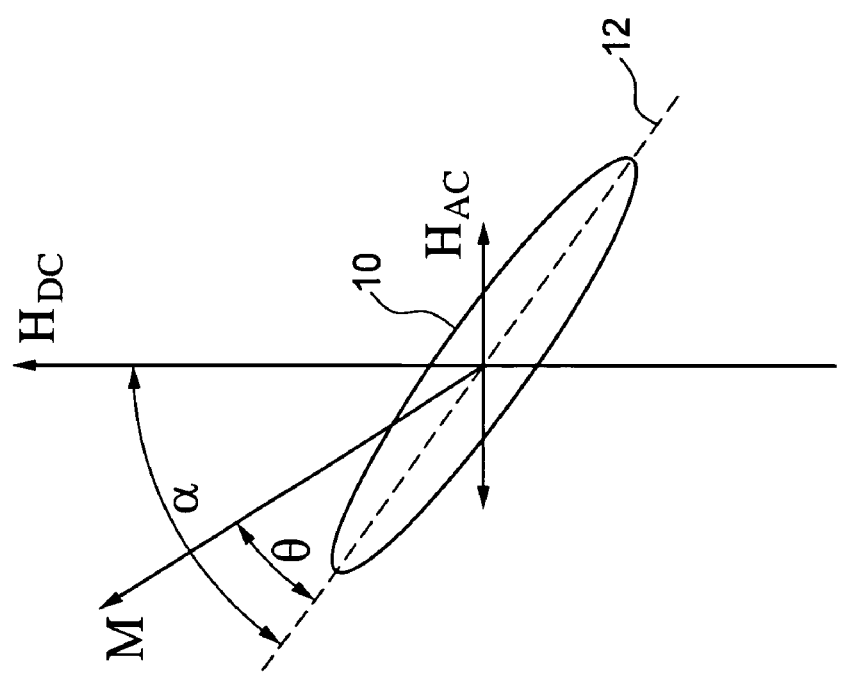
FIG. 1 illustrates the alignment of an ellipsoidal single magnetic domain nanoparticle with uniform magnetization in the presence of a large DC magnetic field.

In methods and systems of the invention, the easy magnetic axis of a magnetic nanoparticle having substantially uniaxial or unidirectional magnetic anisotropy is aligned at an angle to the DC magnetic field of a magnetic resonance system. In preferred embodiments, the angle may be set to produce a predetermined amplification, e.g., maximize amplification. FIG. 1 illustrates the alignment of an ellipsoidal single magnetic domain nanoparticle 10 with uniform magnetization in the presence of a large DC magnetic field;

along the z-axis and a small perpendicular AC magnetic field along the x-axis. The easy anisotropy axis 12 of the nanoparticle 10 (along the ellipsoid long axis) is in the plane defined by the DC and AC magnetic fields, and makes an angle α with the DC applied field. The equilibrium magnetization of the nanoparticle 10 will be at an angle θ away from the easy axis 12.

The single domain magnetic nanoparticle 10 has the shape of a prolate spheroid with a major axis and two equal minor axes (ellipsoid of revolution), where the elongated shape of the particle provides a well-known uniaxial shape anisotropy. However, the following discussion is equally applicable to a spherical nanoparticle with a substantially uniaxial crystalline anisotropy.

The nanoparticle 10 is under the influence of two fields, a large DC magnetic field $H_{DC}$ applied along the z-axis, and a small perpendicular AC magnetic field $H_{AC}$ applied along the x-axis. The easy anisotropy axis 12 of the nanoparticle 10 (along the ellipsoid major axis) is in the plane defined by the DC and AC magnetic fields, and makes an angle α with the DC applied field. The magnetization of the particle is therefore at an angle θ away from the easy axis. For a given angle α, the total angular dependence of energy density of the nanoparticle 10 is:

$$E(\theta) = K_U \sin^2(\theta) - H_{DC} M_S \cos(\alpha-\theta) \pm H_{AC} M_S \sin(\alpha-\theta) \quad (1)$$

where the first term is the uniaxial shape anisotropy energy, the second term is the energy of the particle moment in the large DC magnetic field along the z-axis, and the last term is the energy of the particle moment due to the small AC magnetic field that cycles along the positive/negative x-axis. The uniaxial shape anisotropy constant, $K_U$, depends on the aspect ratio and saturation magnetization of the nanoparticle and has the value of:

$$K_U = \frac{1}{2}(N_a - N_c)M_S^2 \quad (2)$$

where $N_a$ and $N_c$ are the well-known demagnetizing coefficients along the minor and major ellipsoid axes, respectively, and $M_S$ is the saturation magnetization of the magnetic nanoparticle. In magnetic resonance systems, the magnitude of the DC magnetic field is much larger than the magnitude of the perpendicular AC magnetic field, $H_{DC} \gg H_{AC}$.

The susceptibility of the nanoparticle magnetization to the small AC magnetic field $H_{AC}$ in the presence of a large DC magnetic field $H_{DC}$ as $H_{AC} \to 0$ (i.e. $\chi_{RT}$) can be consider for two special cases that illustrate the singularity that occurs in $\chi_{RT}$ at large values of $H_{DC}$.

Figure 2:
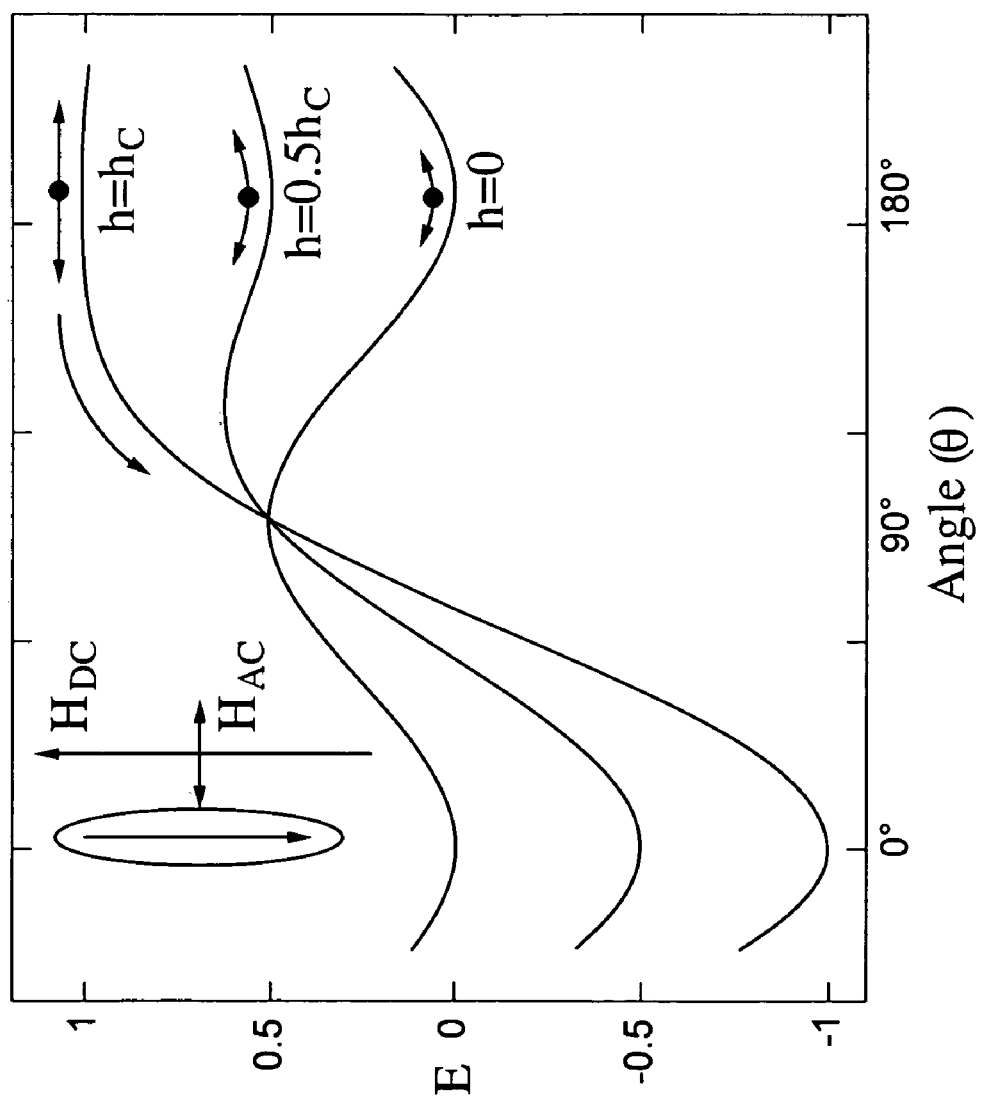
FIG. 2 illustrates the normalized energy diagram of an ellipsoidal single magnetic domain nanoparticle with uniform magnetization, initially oriented anti-parallel to a DC magnetic field at θ=180°, as a function of angle θ and field.

FIG. 2 illustrates the normalized energy diagram of an ellipsoidal single magnetic domain nanoparticle with uniform magnetization, initially oriented anti-parallel to DC magnetic field at θ=180°, as a function of angle θ and the reduced field h=H·$M_S$/2$K_U$. At h=0, a small AC magnetic field along the x-axis and perpendicular to the uniaxial anisotropy axis will drive the magnetization slightly away from the easy axis. As the DC magnetic field is increased along the z-axis, at h=$h_c$/2, the particle remains oriented anti-parallel to the magnetic field, but $\chi_{RT}$ increases. As the DC magnetic field reaches critical value h=$h_c$=2$K_U$/$M_S$, a singularity in $\chi_{RT}$ is obtained. However, this maximum of $\chi_{RT}$ is unstable, as the particle at this critical point irreversibly switches direction to θ=0.

Specifically, in FIG. 2 the DC magnetic field $H_{DC}$ is applied along the nanoparticle uniaxial anisotropy axis. When DC magnetic field is zero, the nanoparticle energy has two stable minima along the anisotropy easy axis, at θ=0° and θ=180°, as determined by the condition that $$\frac{\partial E(\theta)}{\partial \theta} = 0 \text{ and } \frac{\partial^2 E(\theta)}{\partial^2 \theta} > 0.$$

FIG. 2 considers the minimum of θ=180°, where the magnetization of the nanoparticle is initially anti-parallel to the z-axis, as shown in inset of indicated by the dot locations relative to the angle (x-axis) of FIG. 2. A small AC magnetic field along the x-axis and perpendicular to the nanoparticle uniaxial anisotropy axis will drive the magnetization slightly away from the anisotropy easy axis, as indicated by the arrows on the black dot. Therefore, in zero DC magnetic field $H_{DC}$=0, the reversible transverse susceptibility $\chi_{RT}$ is small but non-zero, and the magnetization of the nanoparticle has an alternating component along the x-axis due to the perturbation from the small transverse AC magnetic field $H_{AC}$.

As the DC magnetic field $H_{DC}$ is increased along the z-axis, the angle dependent energy of the particle (Equation 1) changes, but the local energy minima, where $$\frac{\partial E(\theta)}{\partial \theta} = 0 \text{ and } \frac{\partial^2 E(\theta)}{\partial^2 \theta} > 0,$$

are still at θ=0° and θ=180°, as the curve labeled with h=0.5$h_c$ indicates. Therefore, the particle initially at θ=180° will remain oriented anti-parallel to the magnetic field direction as the black dot on the curve labeled with h=0.5$h_c$ indicates. However, the value of $$\frac{\partial^2 E(\theta)}{\partial^2 \theta}$$

at the stable angle of θ=180° is smaller than before, which means that the same transverse AC magnetic field $H_{AC}$ will drive the magnetization further along the x-axis now than it did when the DC magnetic field $H_{DC}$ was zero. The arrows on the black dot on the energy diagram indicate this increase in the angular deviation of the magnetization away from the easy axis, and therefore the increase in the reversible transverse susceptibility $\chi_{RT}$ of the nanoparticle. As the DC magnetic field $H_{DC}$ further increases along the z-axis, a critical point is reached where $$\frac{\partial E(\theta)}{\partial \theta} = 0 \text{ and } \frac{\partial^2 E(\theta)}{\partial^2 \theta} = 0.$$

The transverse AC magnetic field $H_{AC}$ now maximally drives the magnetization away from the easy axis, and this represents a singularity in the reversible transverse susceptibility $\chi_{RT}$. However, the particle at this critical point irreversibly switches direction to the stable equilibrium value at θ=0°, i.e., parallel to the DC magnetic field $H_{DC}$, and the reversible transverse susceptibility $\chi_{RT}$ significantly decreases in value. This is indicated by the h=$h_c$ curve in FIG. 2.

Figure 3:
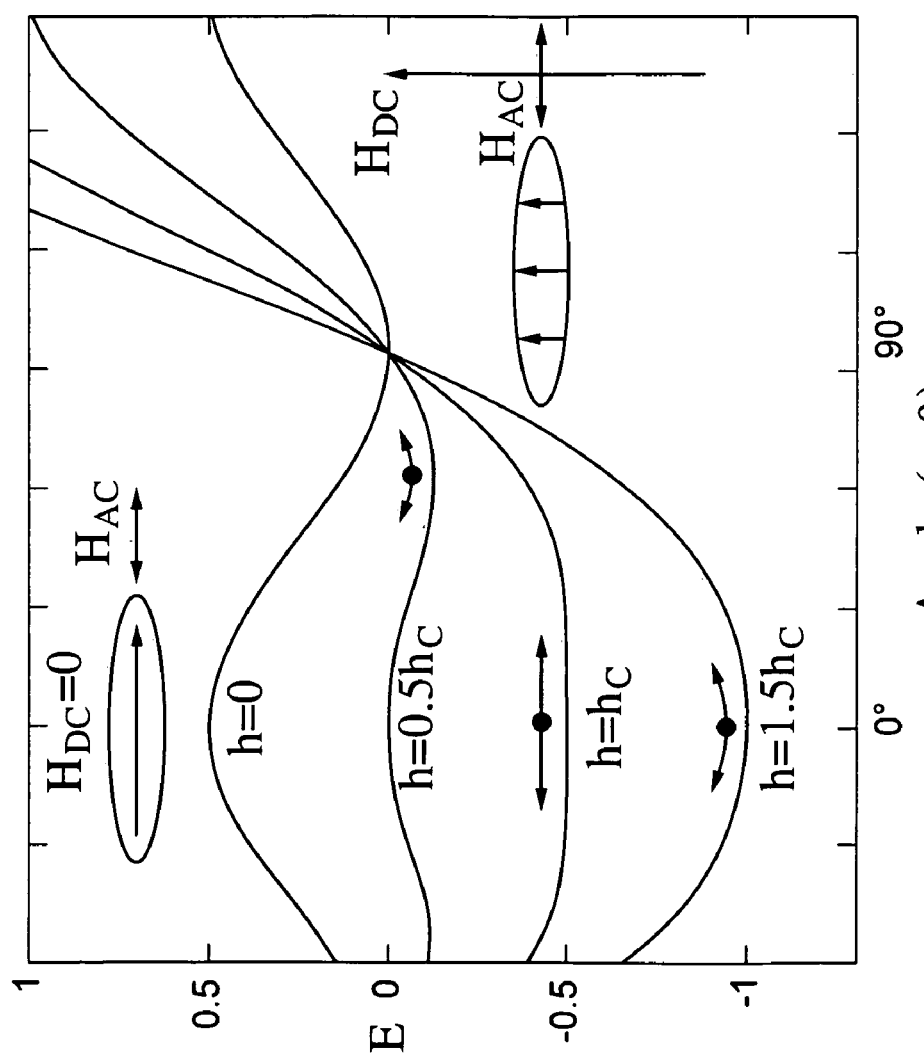
FIG. 3 illustrates the normalized energy diagram of an ellipsoidal single magnetic domain nanoparticle with uniform magnetization, initially oriented perpendicular to a DC magnetic field at α=90°, as a function of angle (α−θ) and field.

The switching problem at the singularity of the reversible transverse susceptibility $\chi_{RT}$, may be avoided with an appropriate alignment of the nanoparticle anisotropic magnetic easy axis. FIG. 3 illustrates the normalized energy diagram of an ellipsoidal single magnetic domain nanoparticle with uniform magnetization, initially oriented perpendicular to DC magnetic field at $\alpha=90°$, as a function of angle ($\alpha-\theta$) and the reduced field $h=H\cdot M_S/2K_U$; At $h=0$, the reversible transverse susceptibility $\chi_{RT}$ is zero. As the DC magnetic field increases along the z-axis, at $h=h_C/2$, $\chi_{RT}$ of the nanoparticle increases. At the critical point $h=h_C$, the particle magnetization is parallel to the DC magnetic field, and the transverse AC magnetic field maximally drives the magnetization along the easy axis. For this angular orientation, the singularity in $\chi_{RT}$ is a stable maximum. If the DC magnetic field $H_{DC}$ is further increased, at $h=1.5h_C$, the particle magnetization remains oriented along the z-axis but $\chi_{RT}$ decreases.

The angle of nanoparticle orientation relative to the DC field is set at an appropriate angle to achieve amplification. Some experiments that were conducted showed a maximum amplification at an angle of 30 to 40 degrees. Other angles also produce amplification including, for example, a perpendicular or substantially perpendicular arrangement.

Specifically, in FIG. 3, as indicated by the upper left inset, the easy axis of the nanoparticle is aligned parallel to the small AC magnetic field $H_{AC}$. This is perpendicular to the DC magnetic field $H_{DC}$, the direction of which is indicated in the lower right inset. Thus, the direction of $H_{DC}$ is perpendicular to the nanoparticle uniaxial anisotropy axis ($\alpha=90°$ in Equation 1). When the DC magnetic field is zero $H_{DC}=0$, the nanoparticle energy again has two stable minima along the anisotropy easy axis, now along the x-axis, determined again by the condition that $$\frac{\partial E(\theta)}{\partial \theta} = 0 \text{ and } \frac{\partial^2 E(\theta)}{\partial^2 \theta} > 0.$$

A small AC magnetic field $H_{AC}$, now parallel to the nanoparticle uniaxial anisotropy axis, does not drive the magnetization along the x-axis. Therefore, in zero DC magnetic field, the reversible transverse susceptibility is zero, $\chi_{RT}=0$.

As the DC magnetic field $H_{DC}$ is increased along the z-axis, the angle dependent energy of the particle again changes, and the local energy minima, where $$\frac{\partial E(\theta)}{\partial \theta} = 0 \text{ and } \frac{\partial^2 E(\theta)}{\partial^2 \theta} > 0,$$

is at an intermediate angle indicated by the black dot on the $h=0.5h_c$ curve. The transverse AC magnetic field $H_{AC}$ along the x-axis will now drive the magnetization slightly along the x-axis, as the arrows on the black dot on the energy diagram indicate, and the reversible transverse susceptibility $\chi_{RT}$ of the nanoparticle will increase.

As the DC magnetic field $H_{DC}$ further increases along the z-axis, a critical point is again reached where $$\frac{\partial E(\theta)}{\partial \theta} = 0 \text{ and } \frac{\partial^2 E(\theta)}{\partial^2 \theta} = 0,$$

as the curve $h=h_c$ indicates. At this critical point, the particle magnetization is parallel to the DC magnetic field $H_{DC}$. The transverse AC magnetic field $H_{AC}$ maximally drives the magnetization along the easy axis, as the arrows on the black dot indicate, and this again represents a singularity in the reversible transverse susceptibility $\chi_{RT}$. However, for this angular orientation, the particle magnetic moment at this critical DC magnetic field $H_{DC}$ does not irreversibly switch, and the singularity in the reversible transverse susceptibility $\chi_{RT}$ is a stable maximum. If the DC magnetic field $H_{DC}$ is further increased, the particle magnetic moment remains oriented along the z-axis as the black dot on the $h=1.5h_c$ curve indicates, but $$\frac{\partial^2 E(\theta)}{\partial^2 \theta} > 0,$$

and the reversible transverse susceptibility $\chi_{RT}$ decreases.

Several points are relevant to the nanoparticle magnetic flux amplification in a magnetic resonance system using the described singularity in the reversible transverse susceptibility $\chi_{RT}$. The value of the critical DC magnetic field $H_{DC}$, where the singularity of reversible transverse susceptibility $\chi_{RT}$ to be utilized in magnetic resonance occurs, is $$H_{CRIT} = \frac{2K_U}{M_S} = (N_a - N_c)M_S \qquad (3)$$

for the nanoparticle orientations in either of FIGS. 2 and 3. An iron nanoparticle is an example magnetic nanoparticle. Inserting the values for the shape anisotropy constant $K_U$ and saturation magnetization $M_S$ for a single magnetic domain elongated 10:1 aspect ratio iron nanoparticle results in the critical field on the order of 1 T. This value of the critical field is attractive, as it falls in the range of the DC polarizing magnetic fields used in magnetic resonance instruments.

It is important to note that the formalism used to describe the singularity of reversible transverse susceptibility $\chi_{RT}$ through analysis of Equation 1 is effectively magneto-static in nature, and does not consider nanoparticle magnetization dynamics. This is justifiable because, in the potential application of ferromagnetic single domain nanoparticles in nuclear magnetic resonance settings, the resonance frequencies of the precessing nuclear magnetic spins (MHz range) are approximately three orders of magnitude lower in value than the electron spin resonant frequencies of the ferromagnetic nanoparticles (GHz range) for the same value of the externally applied DC polarizing field.

Figure 4:
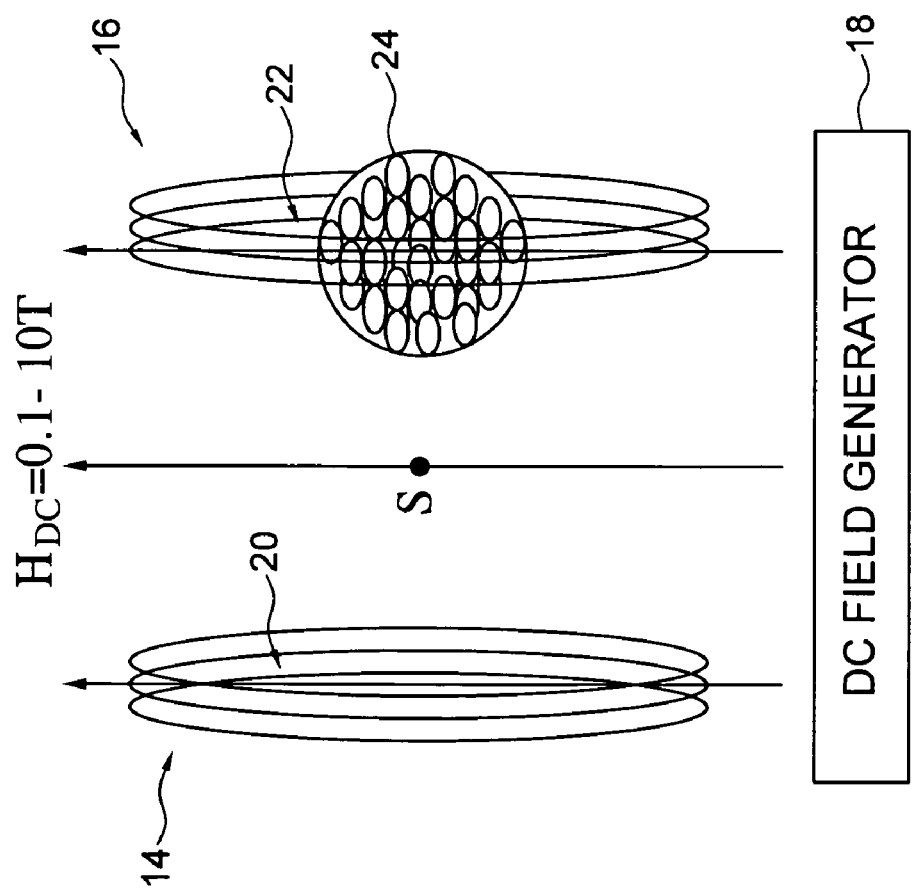
FIG. 4 is a schematic diagram of a magnetic resonance system of the invention with an induction coil having magnetic anisotropy nanoparticles used for amplification of generated and/or detected magnetic fields.

An example magnetic resonance system is schematically shown in FIG. 4. A sample S is disposed between two inductive coils 14, 16. A DC field generator 18 generates, along a z-axis, a large DC field $H_{DC}$, for example in the approximate range of 0.1–10 T. The coils 14 and 16 generate, along an x-axis, a small AC magnetic field $H_{AC}$ perpendicular to the DC field $H_{DC}$. One of the coils 14 acts as a radio-frequency transmitter coil for generating time-dependent magnetic fields perpendicular to the DC magnetic field $H_{DC}$. The other 16 of the coils acts as a radio-frequency receiver coil detecting the weak time-dependent sample generated magnetic fields also perpendicular to the DC magnetic field. The system may include shim coils for improving the field homogeneity. Imaging systems also include current carrying gradient coils for generation of time-dependent spatially varying magnetic fields. The coils may have various shapes, e.g., solenoids, saddles, or birdcages. The coil 14 has a core, generally indicated as 20, that is air-filled, and the coil 16 has core 22 that is modified by insertion of a magnetic nanoparticles 24, with their magnetic anisotropy easy axis oriented at an angle, e.g., perpendicular to $H_{DC}$. For the same applied alternating electric current through both coils 14, 16, the alternating magnetic field along the x-axis at sample S produced by the nanoparticle-filled coil 16 will be significantly larger than the alternating magnetic field along the x-axis produced by the air-core coil 14, even under the influence of the large (e.g., 0.1–10 T) external polarizing DC magnetic field applied along the z-axis by the DC field generator 18, e.g., an electromagnet, permanent magnet, or superconducting magnet A detected signal in the coil 16 will also be larger.

It is also important to recognize that the magnitude of the reversible angular deviation of the magnetic moment component along the x-axis at the singularity point is finite and limited in size, as FIG. 3 indicates. This means that, for the coil 16 of FIG. 4, with the DC magnetic field tuned to the critical field for utilizing the maximum transverse susceptibility $\chi_{RT}$, the angular deviation away from the z-axis of the core magnetization (made from oriented single domain magnetic nanoparticles) will be limited. This statement is valid for both the transverse susceptibility of the core due to the magnetic field generated by the coil in the transmission mode or due to the magnetic field generated by the sample spins in the receiving/detection mode of a magnetic resonance experiment.

Experiments have been conducted to verify the nanoparticle amplification effect of the invention. Additional features of the invention will be apparent to artisans from the following description of experimental results. While the particular materials used in the experiments form part of preferred embodiment magnetic resonance systems, artisans will appreciate that the invention is not limited to the particular materials in the experimental set ups.

Magnetic Resonance Amplification Experiments

An experimental magnetic resonance simulation system was constructed with small inductive coils. Nanoparticles were used from commercially available particulate magnetic recording media (D90 TDK audio recording tape) containing $\gamma$-$Fe_2O_3$ single magnetic domain nanoparticles that are well aligned along the recording direction during the manufacturing process. The recording media, for the purposes of amplification in these experiments, forms a substrate that carries and substantially commonly aligns the $\gamma$-$Fe_2O_3$ single magnetic domain nanoparticles. Since the active magnetic layer of the tape containing the oriented ellipsoidal $\gamma$-$Fe_2O_3$ nanoparticles is typically only 5.5 µm in thickness, we used micro-coil technology for our investigation.

FIGS. 5A and 5B show an experimental arrangement for simulating magnetic resonance conditions consisted of two micro-coils wound on a hollow rectangular capillary tube and distanced by approximately 250 µm apart. Approximately 50 µm wide, 12.5 µm thick tape strip (with 5.5 µm thick layer of magnetic nanoparticles) is cut along the nanoparticle long axis direction and forms the core of one of the micro-coils. In FIGS. 5A and 5B, the left coil simulates a sample. The set-up was placed between the poles of an electromagnet so that the tunable DC magnetic field was applied perpendicular to the micro-coils and nanoparticle easy axis. The micro-coil on the left simulates the sample, while the nanoparticle-filled micro-coil on the right serves as the magnetic EMF flux detector, corresponding to the coil for the case of FIG. 5A, and an air filled coil lacking the nanoparticles 24 in the case of FIG. 5B. The same experimental results were obtained for a reciprocal experimental arrangement where the nanoparticle-filled micro-coil on the right serves as the transmitter of transverse AC magnetic fields, and the micro-coil on the left served as the magnetic flux change detector.

The experiment was carried out by applying a constant magnitude AC current through transmitter micro-coil on the left of FIG. 5A, using a frequency synthesizer (Stanford Research Systems DS335), while the DC magnetic field was swept by the electromagnet. The detected voltage from the nanoparticle-filled micro-coil on the right of FIG. 5A was measured by an RF lock-in amplifier (Stanford Research Systems SR844). Alternating current was applied through the source micro-coil at a frequency of 3 MHz, the maximum available from the synthesizer. This was repeated with the nanoparticle core removed from the detector micro-coil, as shown FIG. 5B, to assess the effectiveness of the single domain magnetic nanoparticles in amplifying the magnetic flux through the detector in the presence of a large DC magnetic field.

FIG. 6 plots results of the detected AC micro-coil voltage from FIGS. 5A and 5B. A peak in the detected AC micro-coil voltage, indicating a singularity in the reversible transverse susceptibility $\chi_{RT}$ of single domain magnetic nanoparticles, occurs at an appreciable value of ~1,250 Gauss perpendicular DC magnetic field. The detected voltage from the micro-coil detector with the nanoparticles removed is also shown on the graph for comparison. These results confirm the amplification effect of the nanoparticles in the simulated magnetic resonance system. The magnetic core material will amplify the AC magnetic flux, and therefore the AC detected voltage, through the inductive coil at an appreciable value of the perpendicular DC magnetic field due to the singularity in the reversible transverse susceptibility $\chi_{RT}$ of the oriented single magnetic domain nanoparticles.

In FIG. 6, the peak in the nanoparticle transverse flux amplification is obtained at a DC magnetic field that corresponds to the few MHz frequency range used in nuclear magnetic resonance. Therefore, the frequency used in the experiment is appropriate, and justifies the magneto-static formalism of the reversible transverse susceptibility $\chi_{RT}$ in single domain magnetic nanoparticles discussed above. Due to their nanometer size scale and insulating nature, there should be no heating or eddy-current magnetic shielding problems with the single magnetic domain nanoparticle core material. The net amplification of the receiver micro-coil voltage is only ~2% in FIG. 6, but this number is related to the core/coil filling factor. When the filling factor is increased, higher amplifications are obtained.

Considering the relative size of the tape magnetic layer and the micro-coil detector, the estimated filling fraction for FIG. 6 to be on the order of ~1–2%. To demonstrate that this can be improved by a better filling factor, a slightly larger micro-coil set-up that could accommodate multiple nanoparticle tape layers, but was otherwise the same in design as the set-up of FIGS. 5A and 5B was constructed.

FIG. 7 shows the result of the experiment, comparing the data from the same inductive coil detector filled with a single nanoparticle tape layer and then four nanoparticle tape layers. The higher amplification from the higher filling factor is evident. To further explore the filling factor effect, millimeter scale coils with ~100 nanoparticle tape layers filling the coil in the arrangement were also made. Although the filling factor is still estimated to be less than 50%, due to the mostly non-magnetic material of the tape layers, the amplification effect, shown in FIG. 8, now has an appreciable ~75% gain at the critical DC magnetic field value. Construction of special purpose cores with magnetic nanoparticles, providing higher packing fractions, better alignment, and higher coil filling factors will further raise the amplification gain.

Another variant of the experiment shown of FIG. 5A was conducted to demonstrate the potential for tuning the value of the DC bias magnetic field where the peak in the reversible transverse susceptibility $\chi_{RT}$ occurs. This enables tuning of the value of the nuclear magnetic resonance frequency detected. In all the measurements presented so far, the DC magnetic field was applied parallel to the nanoparticle tape surface but perpendicular to the nanoparticles easy axis, while the small AC magnetic field was applied parallel to the nanoparticle easy axis as required to obtain a maximum in the reversible transverse susceptibility $\chi_{RT}$.

FIG. 9 presents data and shows the measurement for the same arrangement of the transmitter and detector coils with respect to the nanoparticle layer as shown FIG. 5A, but now with a DC magnetic field applied perpendicular to the tape surface, as shown in the inset of FIG. 9. The conditions for obtaining the maximum of the reversible transverse susceptibility $\chi_{RT}$ are still satisfied. However, the data shows that the peak value of the magnetic field shifts significantly upwards from ~1,250 Gauss (also shown in the figure) to ~3,000 Gauss, with a small increase in the gain value. The reason for this upward shift is the well-known demagnetizing field of the entire thin nanoparticle tape layer (effectively the shape of an infinite plane) that the externally applied DC magnetic field has to overcome in order to reach the critical field for singularity in the reversible transverse susceptibility $\chi_{RT}$. This effect can therefore be utilized to partially tune the value of the magnetic field at which the nuclear magnetic resonance experiment is performed, although it is likely that the highest value will be chosen in order to maximize the spin polarization and the spin resonance frequency, both of which are advantageous in improving the signal-to-noise ratio in inductive coil detection.

Composite Nanoparticle for Maximum Amplification

Further amplifying the angular deviation of the nanoparticle magnetic moment away from the anisotropy axis under the influence of a large DC magnetic field and a small perpendicular AC field can produce further amplification. A preferred nanoparticle to accomplish this is a composite ferromagnetic/anti-ferromagnetic spherical core/shell nanoparticle, with the well-known exchange-biased unidirectional magnetic anisotropy. This particle is shown in FIG. 10. The particle 30 has a ferromagnetic core 32 and an anti-ferromagnetic shell 34. The exchange-biased unidirectional magnetic anisotropy is indicated in the shell 34.

The reversible transverse susceptibility $\chi_{RT}$ in single domain magnetic nanoparticles describes how, under critical DC magnetic field and proper nanoparticle angular orientation, a singularity will occur where $$\frac{\partial E(\theta)}{\partial \theta} = 0 \text{ and } \frac{\partial^2 E(\theta)}{\partial^2 \theta} = 0.$$

At that point, the transverse AC magnetic field $H_{AC}$ will maximally force the magnetic moment component along the x-axis and away from the DC magnetic field direction. However, it was discussed above that the magnitude of that angular deviation was finite and limited in size. The reason for this limitation is the format of the nanoparticle energy density expressed in Equation 1. For a single magnetic domain nanoparticle, the energy equation contains the $\sin^2(\theta)$ term from the particle uniaxial anisotropy and the $\cos(\theta)$ term for the anisotropy due to an applied field. Under these conditions, it is impossible to apply a magnetic field so that the energy becomes independent of angle, a condition that would maximize the reversible transverse susceptibility $\chi_{RT}$. The best that can be achieved is a condition where $$\frac{\partial E(\theta)}{\partial \theta} = 0 \text{ and } \frac{\partial^2 E(\theta)}{\partial^2 \theta} = 0$$

over a limited angular range.

The challenge, then, is to design a magnetic nanoparticle anisotropy with the angular dependence that would together with the $\cos(\theta)$ term for the particle magnetic moment in an applied field make the total energy of the nanoparticle angle independent over the entire angular range. The ideal candidate is the unidirectional anisotropy in exchange biased ferromagnetic/anti-ferromagnetic composite nanoparticles, first discovered in oxidized cobalt nanoparticles, that has precisely the $\cos(\theta)$ angular dependence required. Anti-ferromagnetic exchange bias on ferromagnetic materials is well known for the effect of shifting the hysteresis loop of a ferromagnet and has been extensively used in magnetic thin film multi-layer structures with applications towards magnetic recording sensor technology. However, in the context of angular dependence of the anisotropy that the anti-ferromagnetic phase exerts on the ferromagnetic phase at their mutual interface, the exchange bias is known to provide a unidirectional magnetic anisotropy with the $\cos(\theta)$ angular dependence.

The spherical ferromagnetic core 32 nanoparticle with no shape or crystalline anisotropy surrounded by an anti-ferromagnetic shell 34 forms a nanoparticle 30 that is exchange biased along the negative z-axis. Such a nanoparticle can be produced by the standard practice in exchange bias research of first heating the structure above the anti-ferromagnetic transition temperature and then field-cooling it in the presence of a large bias magnetic field in the negative z-direction. The energy density of the nanoparticle 30 can now be expressed by:

$$E(\theta) = -K_U \cos(\theta) + H_{DC} M_S \cos(\theta) \pm H_{AC} M_S \sin(\theta) \quad (4)$$

where the first term is the unidirectional exchange bias anisotropy energy, the second term is the energy of the particle moment in the DC magnetic field along the z-axis, and the last term is the energy of the particle moment due to the AC magnetic field that cycles along the positive/negative x-axis.

The susceptibility of the nanoparticle magnetization to the small AC magnetic field $H_{AC}$ in the presence of a large DC magnetic field $H_{DC}$ as $H_{AC} \rightarrow 0$ can now be reconsidered (i.e. $\chi_{RT}$) for the nanoparticle 30. When DC magnetic field is zero, the nanoparticle energy now has only one stable minimum along the exchange anisotropy unidirectional axis, as determined by the condition that $$\frac{\partial E(\theta)}{\partial \theta} = 0 \text{ and } \frac{\partial^2 E(\theta)}{\partial^2 \theta} > 0$$

for Equation 4, resulting in the magnetization of the nanoparticle being initially anti-parallel to the z-axis. This is shown in FIG. 11 for the h=0 curve and indicated by the black dot on the angle-dependent energy diagram. A small AC magnetic field along the x-axis and perpendicular to the nanoparticle unidirectional anisotropy axis will drive the magnetization slightly away from the anisotropy easy axis, as indicated by the arrows on the black dot. Therefore, in zero DC magnetic field, the reversible transverse susceptibility $\chi_{RT}$ is small but non-zero, and the magnetization of the nanoparticle has an alternating component along the x-axis due to the perturbation from the small transverse AC magnetic field $H_{AC}$.

As the DC magnetic field $H_{DC}$ increases along the z-axis, the angle dependent energy of the particle (Equation 4) changes, but the local energy minimum, where $$\frac{\partial E(\theta)}{\partial \theta} = 0 \text{ and } \frac{\partial^2 E(\theta)}{\partial^2 \theta} > 0$$

is still in the negative z-direction, as the h=0.5$h_c$ curve shows. Therefore, the particle will remain oriented antiparallel to the magnetic field direction as the black dot on the diagram indicates. However, the value of $$\frac{\partial^2 E(\theta)}{\partial^2 \theta}$$

at the stable angle is now smaller, and the same transverse AC magnetic field $H_{AC}$ will drive the magnetization further along the x-axis now than it did when the DC magnetic field $H_{DC}$ was zero. The arrows on the black dot on the energy diagram indicate this increase in the angular deviation of the magnetization away from the easy axis, and therefore the increase in the reversible transverse susceptibility $\chi_{RT}$ of the nanoparticle.

As the DC magnetic field $H_{DC}$ further increases along the z-axis, a critical point is reached where $$\frac{\partial E(\theta)}{\partial \theta} = 0 \text{ and } \frac{\partial^2 E(\theta)}{\partial^2 \theta} = 0.$$

However, this condition is now satisfied for the entire angular range from 0 to ±π, as the flat energy curve for h=$h_c$ shows, and the particle has no angularly dependant energy. The reason for this is the intended exact cancellation of the two cos(θ) terms in Equation 4 at the critical field value of:

$$H_{CRIT} = \frac{K_U}{M_S} \quad (5)$$

Therefore, at this singularity in the reversible transverse susceptibility $\chi_{RT}$, the transverse AC magnetic field $H_{AC}$ will now alternate the nanoparticle magnetization direction along the x-axis between the theoretically maximum angular values from −90° to +90°. If the DC magnetic field $H_{DC}$ is further increased along the positive z-axis, the particle magnetic moment orients along the positive the z-axis, as the black dot on the h=1.5$h_c$ curve shows, but $$\frac{\partial^2 E(\theta)}{\partial^2 \theta} > 0,$$

and the reversible transverse susceptibility $\chi_{RT}$ decreases.

Example Magnetic Resonance Systems

The amplification effect provide by the invention will have many applications in magnetic resonance systems.

FIG. 12 shows a spherical enclosure 40 made from the high-$\chi_{RT}$ magnetic material that surrounds a sample and contains all the required current carrying devices 42 for transmission, detection, and gradient magnetic field generation. Such an enclosure would ensure that the sample still experiences a uniform polarizing magnetic field, while the generation and detection of the transverse magnetic fields by the current carrying structures embedded in the enclosure is amplified by the described singularity of the $\chi_{RT}$ in the magnetic nanoparticles that the enclosure encases. The FIG. 12 structure might be used, for example, in a spectroscopic magnetic resonance system. The spectrometer current carrying devices 42 can be precisely oriented shim coils can be used for tuning the field uniformity, which is especially important in spectroscopic magnetic resonance systems.

Another application of the amplification methods of the invention is to atomic resolution magnetic resonance microscopy. The achievement of three-dimensional atomic resolution MRI remains one of the main challenges in the visualization of nanomaterials and biological molecules. The prospects for reaching this goal have be greatly advanced by the recent developments in Magnetic Resonance Force Microscopy in terms of sensitivity, imaging resolution, and quantum measurement protocols using micro-mechanical detectors for magnetic resonance sensing. Although the comparison of mechanical and inductive detection of magnetic resonance has been previously described, the amplification effect of the invention requires reconsideration of the detection modes. In one comparison, a millimeter sized inductive coil is compared to a micron scale mechanical cantilever. Such analysis neglects the possibility of improvements in the inductive detection technology both in terms of miniaturization of coils and introduction of novel ideas into the inductive detection techniques. The concept of magnetic flux amplification through the coil in the presence of a large DC magnetic field by the singularity in the reversible transverse susceptibility $\chi_{RT}$ of magnetic nanoparticles provided by the invention addresses this issue.

The amplification effect of the invention using high-$\chi_{RT}$ magnetic material can be used, for example to amplify magnetic resonance signals detected by miniaturized coils, SQUID detectors, or micro-Hall elements, and towards a scanning probe magnetic resonance flux microscopy as a viable alternative to the scanning probe magnetic resonance force microscopy.

FIG. 13 is an image of an experimental device that demonstrates the feasibility of these types of integration. A micro-coil is wound near the cleaved end of a 65 μm diameter optical fiber. A 15 μm diameter nickel micro-sphere is mounted on the end-face of the cleaved optical fiber. Although the micro-sphere imaged is not made from the flux amplifying magnetic material of the invention, such high-$\chi_{RT}$ magnetic material as part of the flux detector probe is contemplated. Considering the recent progress in the theory and fabrication of micro/nanometer scale helical structures, a configuration where an individual single magnetic domain nanoparticle or an individual exchange biased core/shell nanosphere is integrated into such a helical magnetic flux nanodetector is another example application. Another detector that is contemplated is an individual high-$\chi_{RT}$ nanoparticle encapsulated in a carbon nanotube that performs the function of a nanosolenoid.

Any properly oriented anisotropic single domain magnetic or exchange biased nanoparticle may be used in methods and systems of the invention if it exhibits reversible transverse susceptibility in the applicable range of DC magnetic fields. To assist in the selection of appropriate nanoparticles, the invention also describes methods for determining the reversible transverse susceptibility of nanoparticles.

The reverse transverse susceptibility of nanoparticles of different sizes and materials can be determined with by re-configuring an alternating gradient magnetometer. This technique can be used to measure both reversible parallel and transverse susceptibilities with high sensitivity. A sample is positioned off-axis with respect to the magnetometer gradient field coils. This creates a signal at twice the frequency of the gradient field that is directly proportional to the reversible susceptibility. Off-setting the sample along the x-axis results in a sensor signal proportional to the reversible parallel susceptibility, while rotating the sample holder by 90 degrees and offsetting it along the y-axis results in a sensor signal proportional to the reversible transverse susceptibility. This technique has been confirmed experimentally.

Details of the experiments will now be discussed. The measurement techniques form a preferred embodiment for selection of appropriate nanoparticles and will be especially useful for selecting an optimal nanoparticle material given a certain resonance DC field in a magnetic resonance system of the invention. However, nanoparticles may be selected by other techniques, including but not limited, experimental trial and error. For example, as outlined above, the amplification effect of nanoparticles can be determined in magnetic resonance system of the invention. Thus, nanoparticles providing higher amplifications could be selected for a given system in accordance with the invention. Conventional methods may also be used to measure susceptibility, including for example, induction methods.

A modified off-axis implementation of an alternating gradient magnetometer is shown in FIG. 14 a sample 50 is placed on a mechanical cantilever sample holder 52, and centered between a pair of gradient coils 54 that apply an alternating gradient magnetic field at the sample location. In a conventional magnetometer, the sample 50 is centered, but in FIG. 14 it is offset along the x-axis. A piezoelectric bimorph 55 serves as a vibration detector, and is aligned so that its sensing axis is along the x-direction and provides a voltage signal proportional to the force on the sample. For a sample of non-zero magnetic moment, the cantilever 52 will experience an alternating magnetic force on the sample 50:

$$F = \nabla(\vec{m} \cdot \vec{H}) \quad (6)$$

If the alternating gradient magnetic field is applied at the resonant frequency of the sample holder, the amplitude of the sample holder vibration can be greatly amplified by a factor of Q, the mechanical quality factor of the sample holder 52. This tuning to the mechanical resonant frequency is critical, and allows for a greatly enhanced moment sensitivity in the AGM. When an external uniform DC magnetic field is also applied at the sample 50 by a magnet, two pole pieces 56 in FIG. 14, the value of the oscillation amplitude is proportional to the value of the field dependent magnetic moment. By measuring the amplitude of vibration as a function of an applied uniform DC magnetic field, a hysteresis loop of the sample can be obtained.

In reversible parallel and transverse susceptibility experimental measurements, an alternating gradient magnetometer from the Princeton Measurements Corporation (Model MicroMag 2900) was used. For the case of the most commonly used AGM arrangement, the DC magnetic field, $H_X$, is applied in the x-direction, with the gradient coils also aligned along the x-axis providing an alternating spatially varying field, $h_X$. This magnetic field, $h_X$, is zero at the center of symmetry of the gradient coil pair, and increases with the distance from the center. For a sample centered between the gradient coils, according to Equation (6), the alternating force on the sample is along the x-direction:

$$F_X = m_X(H_X) \cdot \frac{\partial h_X}{\partial x} \quad (7)$$

The force is proportional to the value of the magnetic moment of the sample (which is dependent on the uniform DC magnetic field, $H_X$, applied to it) and to the value of the gradient of the spatially varying alternating magnetic field, $h_X$. This alternating force is the source of the piezo voltage signal at the resonant frequency of the sample holder system to which the gradient field is tuned. In the experimental arrangement used, the value of the gradient field is 15 (Oe/mm), and the resonant frequency is typically around f=700 (Hz) with a typical quality factor Q of approximately 25. FIG. 15 shows a hysteresis loop along the easy magnetization direction of a magnetic data storage tape sample (Fuji 90 Type II containing chromium dioxide, $CrO_2$, magnetic nanoparticles that are well aligned along the recording direction during the manufacturing process) measured by the AGM with the sample centered between the gradient coil pair.

Susceptibility measurements can be made by moving the sample 50 off center. It is instructive to consider the total force on the magnetic sample when it is intentionally positioned off-center with respect to the gradient coil pair 54 along the x-axis, while still being centered along the y and z axes. In this case, the sample 50 experiences the spatially uniform DC magnetic field, $H_X$, and the spatially varying alternating magnetic field, $h_X$, which is now non-zero at the sample location. Therefore, the total force on the sample is:

$$F_X = m_X(H_X) \cdot \frac{\partial h_X}{\partial x} + m_X(h_X) \cdot \frac{\partial h_X}{\partial x} \quad (8)$$

For small values of $h_X$, this additional sample magnetic moment due to non-zero $h_X$ is proportional to the product of $h_X$, sample volume V, and the reversible parallel susceptibility, $\chi_{RP}$, of the material, according to the standard definition of magnetic susceptibility. Therefore, equation (8) for the total force on the sample takes the form:

$$F_X = m_X(H_X) \cdot \frac{\partial h_X}{\partial x} + \chi_{RP} \cdot V \cdot h_X \cdot \frac{\partial h_X}{\partial x} \quad (9)$$

This equation indicates that the sample experiences two forces, with the important distinction that these two forces act on the sample at two different frequencies. The first term in equation (9) describes the force that is the product of the DC magnetic moment of the sample (due to the DC magnetic field $H_X$) and the value of the magnetic field gradient at the sample location. Since the alternating gradient field is operating at frequency f, the force signal from this first term in Equation (9) is also at the frequency f. The second term in equation (9) is proportional to the product of four terms: the reversible parallel susceptibility $\chi_{RP}$ of the sample (at a particular value of the DC magnetic field), the volume V of the magnetic material, the field at the sample location from the gradient coils, $h_X$, and the value of the magnetic field gradient at the sample location. Since magnetic field from the gradient coils, $h_X$, is time varying at frequency f, and the gradient of that field is also time varying at frequency f, the second term in equation (9) will be at 2f, twice the frequency of the gradient coils. Since the magnetometer narrow band amplifier is tuned to detect the signal at the resonant frequency of the sample holder, f=700(Hz), the same frequency at which the gradient coils operate, the second term in equation (4) for the force on the sample at f=1,400(Hz) is not detected. However, if the field from the gradient coils is intentionally applied at half of the resonant frequency of the sample holder, f=350(Hz), the signal that is proportional to the reversible parallel susceptibility $\chi_{RP}$ of the sample (the second term in equation 4) will be at the resonant frequency of the sample holder, f=700(Hz), and can be sensitively detected using an additional lock-in amplifier (The total amplitude detection mode of the Stanford Research Systems SR830 Lock-In Amplifier was used so that problems of relative phases are avoided). Therefore, by (a) offsetting the sample position along the x-axis, (b) operating the gradient coils at a frequency that is at half the value of the resonant frequency of the sample holder, and (c) detecting the piezo signal at the resonant frequency of the sample holder, one can directly measure the signal proportional to the reversible parallel susceptibility, $\chi_{RP}$, of the magnetic sample. It is emphasized that only the reversible parallel susceptibility is measured in this method, as other possible harmonics (potentially due to irreversible magnetization processes) are not detected by the narrow bandwidth detection technique.

FIG. 16 shows the measurement of $\chi_{RP}$ performed on the same aligned nanoparticle sample for which the hysteresis loop was presented in FIG. 15. The measured data for $\chi_{RP}$ is in general agreement with the theory of reversible parallel susceptibility in single magnetic domain nanoparticle systems. In the present experimental measurement, the sample was offset from the centered position along the x-axis by 1(mm) which means that the alternating maximum magnetic field from the gradient coils at the sample location was 15(Oe) operating at 350(Hz).

It is instructive to graphically consider $h_X$ and its gradient along the x-axis since they enter the force equation (9). These fields and field gradients can be modeled, since analytical expressions for the magnetic field from circular coils are well known. In the experiments, the gradient coils were 1(cm) in diameter and 1(cm) apart. Since the magnetic field and field gradient values from the gradient coils are known, and if the volume V of the material is known, one could in principle calibrate for the actual values of $\chi_{RP}$ by using the second term in equation (9) which is utilized in measurement of $\chi_{RP}$. However, the volume V of the sample is difficult to determine, and therefore the graphic representations can aid this determination, in a similar fashion to the y-axis plots in FIGS. 18A and 18B, as discussed below.

This example above demonstrates that the alternating gradient force magnetometer, properly reconfigured, can be used as a sensitive susceptometer without any hardware changes on the AGM, but requiring an additional lock in amplifier channel that detects the signal at twice the frequency of the gradient coils. Sensitive measurements of susceptibility are commonly performed using inductive methods, with the demonstrated sensitivity for measuring samples with moments of $1\times10^{-8}$(emu). In the above method, similar sensitivity is achieved by using the piezoelectric bimorph as the vibration detector. Much higher sensitivity can be obtained by the above method if smaller detectors with higher quality factors and ultra-high gradient field coils are used.

Reversible transverse susceptibility, $\chi_{RT}$, is defined as the variation of sample magnetization as a function of small magnetic field applied perpendicular to the main bias DC field and measured along the small magnetic field. Alternating gradient magnetometry can also be used for the measurement of reversible transverse susceptibility, $\chi_{RT}$. As the definition of $\chi_{RT}$ indicates, the measurement of reversible transverse susceptibility requires both a DC magnetic field and a small magnetic field perpendicular to the main DC field. In addition, the ability to measure the magnetization parallel to the small magnetic field and perpendicular to the main DC magnetic field is also required. Consideration of the magnetic fields and field gradients from the AGM gradient coil pair demonstrates that a measurement of the $\chi_{RT}$ is possible if the piezoelectric bimorph sensing direction is rotated by 90 degrees around the z-axis and the sample is centered along the x-axis but is offset along the y-axis. At such a location, referring again to FIG. 14, the sample 50 experiences the uniform DC magnetic field from the electromagnet 56 along the x-axis, and a non-uniform alternating magnetic field from the AGM gradient coils 54, which is now along the y-axis at the sample location, i.e., perpendicular to the DC magnetic field. The sample holder 52 may be easily rotated by 90 degrees so that the piezoelectric bimorph 55 sensing direction is along the y-axis only. Since the DC field is along the x-direction, it does not contribute to the magnetic moment and force along the y-direction, and therefore, the force on the sample along the y-direction sensing piezoelectric bimorph is:

$$F_Y = m_Y(h_Y) \cdot \frac{\partial h_Y}{\partial y} \qquad (10)$$

For small values of $h_Y$, the sample's magnetic moment along the y-direction is proportional to the product of $h_Y$, sample volume V, and the reversible transverse susceptibility, $\chi_{RT}$, of the material:

$$F_Y = \chi_{RT} \cdot V \cdot h_Y \cdot \frac{\partial h_Y}{\partial y} \qquad (11)$$

The force on the sample along the y-direction is then proportional to the product of four terms: the reversible transverse susceptibility, $\chi_{RT}$, of the sample (at a particular value of the DC magnetic field), the volume, V, of the magnetic material, the magnetic field at the sample location along the y-direction from the gradient coils, $h_Y$, and the value of the magnetic field gradient along the y-direction at the sample location. Again, since the magnetic field from the gradient coils, $h_Y$, is time varying at frequency f, and the gradient of that field is also time varying at frequency f, their product will be at 2f, twice the frequency of the gradient coils. Therefore, by (a) rotating the sample holder by 90 degrees from the original x-axis sensing direction into the y-axis sensing direction (b) offsetting the sample position along the y-axis but still centered along the x-axis, (c) operating the gradient coils at a frequency that is at half the value of the resonant frequency of the sample holder, and (d) detecting the piezo signal at the resonant frequency of the sample holder, one can measure the signal proportional to the reversible transverse susceptibility, $\chi_{RT}$, of a magnetic sample. It is emphasized again that only the reversible transverse susceptibility is measured in this method, as other possible harmonics (potentially due to irreversible magnetization processes) are not detected by the narrow bandwidth detection technique. FIG. 17 shows the measurement of $\chi_{RT}$ performed on the same aligned nanoparticle sample for which the hysteresis loop was presented in FIG. 15. The measured data for $\chi_{RT}$ is again in general agreement with the theory of reversible transverse susceptibility in single magnetic domain nanoparticle systems, and is comparable to previously measured $\chi_{RT}$ using inductive methods. FIGS. 18A and 18B show the numerically computed plots of the magnetic field and magnetic field gradient from the gradient coils along the y-direction, while FIG. 18C shows the plot of the product of magnetic field and magnetic field gradient along the y-direction (the last two terms in the product of equation 11). It is apparent that the sample has to be carefully positioned along the y-axis in order to maximize the signal. In FIG. 19, the variation of the $\chi_{RT}$ signal with position along the y-axis is illustrated, and the measured data closely match the numerical y-axis dependence of FIG. 18C. In our measurement, the sample was offset from the centered position along the y-axis by 5(mm) which means that the maximum alternating magnetic field from the gradient coils at the sample was again 15(Oe) operating at 350(Hz). Since the volume V of the sample is difficult to determine, calibration of the $\chi_{RT}$ values is unreliable, and the units in the figures are again arbitrary.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for amplifying generated or detected alternating magnetic flux of an induction coil in the presence of a large DC magnetic field, the method comprising steps of:
    disposing nanoparticles having substantially uniaxial or unidirectional magnetic anisotropy in combination with a reversible transverse susceptibility at the level of the large DC magnetic field within the induction coil and with their nanoparticle magnetic easy axes substantially commonly aligned at an angle relative to the large DC magnetic field; and
    establishing an alternating current within the induction coil whereby a magnetic flux signal that is generated or detected by the induction coil is amplified by the presence of the nanoparticles within the induction coil.

2. The method of claim 1, wherein the nanoparticle easy axes are substantially commonly aligned relative to the DC magnetic field at an angle to maximize amplification of the magnetic flux.

3. The method of claim 1, wherein the nanoparticles are carried by a substance.

4. The method of claim 1, wherein the nanoparticles comprise $\gamma$-$Fe_2O_3$ single magnetic domain nanoparticles.

5. The method of claim 1, wherein the nanoparticles comprise exchange biased nanoparticles having ferromagnetic cores and anti-ferromagnetic shells.

6. The method of claim 1, wherein the coil comprises an induction coil in a magnetic resonance system and the large DC magnetic field is the magnetic field of the magnetic resonance system.

7. In a magnetic resonance system having alternating current generation and detection in inductive coils disposed in the presence of a magnetic resonance DC bias field, an improvement comprising nanoparticles having substantially uniaxial or unidirectional magnetic anisotropy in combination with a reversible transverse susceptibility at the level of the magnetic resonance DC bias field, the nanoparticles being disposed within the core of at least one of the inductive coils and positioned relative to the DC bias field in order to amplify magnetic flux in the at least one of the inductive coils.

8. The system of claim 7, wherein the magnetic easy axes of the nanoparticles are substantially commonly aligned relative to the DC bias field at an angle to maximize amplification of the magnetic flux.

9. The system of claim 8, wherein the nanoparticles are carried by a substrate.

10. The system of claim 7, wherein the nanoparticles comprise $\gamma$-$Fe_2O_3$ single magnetic domain nanoparticles.

11. The system of claim 7, wherein the nanoparticles comprise exchange biased nanoparticles having ferromagnetic cores and anti-ferromagnetic shells.

12. A magnetic resonance system, the system comprising:
    DC magnetic generation means for generating a polarizing DC magnetic field; and
    inductive coil means for generating excitation time-dependent magnetic fields perpendicularly to the DC magnetic field and for detecting weak time-dependent sample generated magnetic fields; said inductive coil means including nanoparticle amplification means for amplifying at least one of the excitation time-dependent magnetic fields and the weak time-dependent sample generated magnetic fields.

13. The system of claim 12, wherein said nanoparticles amplification means amplifies both of the excitation time-dependent magnetic fields and the weak time-dependent sample generated magnetic fields.

* * * * *